(12) United States Patent
Dent

(10) Patent No.: US 6,731,763 B1
(45) Date of Patent: *May 4, 2004

(54) AUDIO A/D CONVERTER USING FREQUENCY MODULATION

(75) Inventor: Paul W. Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/542,959

(22) Filed: Apr. 3, 2000

Related U.S. Application Data

(62) Division of application No. 08/657,388, filed on Jun. 3, 1996.

(51) Int. Cl.[7] .......................... H04R 3/00; H03M 1/12; H03M 1/60
(52) U.S. Cl. ...................... 381/114; 381/113; 341/155; 341/157
(58) Field of Search ............................... 381/113, 114, 381/3, 4, 56, 124; 341/157, 155, 126, 127, 158; 327/7

(56) References Cited

U.S. PATENT DOCUMENTS

| | | | |
|---|---|---|---|
| 3,305,638 A | * 2/1964 | Teachout | 381/113 |
| 3,533,101 A | 10/1970 | Lauchner et al. | 341/157 |
| 3,656,132 A | * 4/1972 | Brumbelow | 340/870.28 |
| 3,825,848 A | * 7/1974 | Sternbeck | 381/114 |

(List continued on next page.)

FOREIGN PATENT DOCUMENTS

| | | | | |
|---|---|---|---|---|
| GB | 2027297 A | * 2/1980 | | |
| GB | 2270596 | 3/1994 | | 415/121.3 |
| JP | 62000200 | of 1987 | | |
| JP | 02177646 | of 1990 | | |
| JP | 07058549 | of 1995 | | |
| JP | 07023492 A | * 1/1995 | | H04R/3/00 |

OTHER PUBLICATIONS

International Search Report Re PCT/US97/09038, Nov. 1997.

*Primary Examiner*—Xu Mei
*Assistant Examiner*—Laura A. Grier
(74) *Attorney, Agent, or Firm*—Coats & Bennett, P.L.L.C.

(57) ABSTRACT

According to the exemplary embodiments, a voltage or current-controlled oscillator is controlled in frequency by the signal (i.e., voltage or current) from a microphone. The frequency modulated signal is applied to a direct digital discriminator that produces a digital representation of the instantaneous frequency at the desired speech sampling rate. The digital discriminator may be formed, for example, by applying the oscillator signal to a direct phase digitizing circuit along with a reference frequency and calculating a sequence of instantaneous phases of the oscillator relative to the reference frequency. The phase sequence is then applied to a digital phase locked loop (or otherwise numerically differentiated) to generate a sequence of binary words representative of instantaneous frequency and therefore representative of the speech waveform. Since the low-level speech waveform substantially does not enter the integrated circuit except as a high-level frequency-modulated carrier, the technique is immune to noise caused by high speed random logic circuits such as microprocessors and DSPs operating on the chip.

4 Claims, 30 Drawing Sheets

U.S. PATENT DOCUMENTS

| | | | | |
|---|---|---|---|---|
| 4,156,800 A | * | 5/1979 | Sear et al. | 381/114 |
| 4,442,323 A | | 4/1984 | Yoshida et al. | 381/113 |
| 4,471,340 A | * | 9/1984 | Lewis | |
| 4,535,205 A | * | 8/1985 | Ravinet et al. | 381/114 |
| 4,593,266 A | | 6/1986 | Palmer | 341/157 |
| 4,739,278 A | * | 4/1988 | Des Brisay, Jr. et al. | 328/133 |
| 4,758,821 A | * | 7/1988 | Nelson et al. | 340/347 |
| 4,759,069 A | | 7/1988 | Bernstein et al. | 381/56 |
| 4,847,903 A | | 7/1989 | Schotz | 381/3 |
| 5,084,669 A | * | 1/1992 | Dent | 328/134 |
| 5,126,743 A | | 6/1992 | Hobbs | 341/157 |
| 5,157,730 A | * | 10/1992 | Liu | 381/111 |
| 5,189,420 A | | 2/1993 | Eddy et al. | 341/157 |
| 5,220,275 A | | 6/1993 | Holmqvist | 324/76.77 |
| 5,222,144 A | * | 6/1993 | Whikehart | 381/15 |
| 5,315,583 A | | 5/1994 | Murphy et al. | 370/312 |
| 5,455,868 A | | 10/1995 | Sergent et al. | 381/56 |
| 5,461,643 A | * | 10/1995 | LaRosa et al. | 375/329 |
| 5,579,397 A | * | 11/1996 | Ikeda et al. | 381/113 |
| 5,608,793 A | * | 3/1997 | Uriya | 379/387 |
| 5,627,899 A | * | 5/1997 | Craven et al. | 381/103 |
| 5,649,020 A | * | 7/1997 | McClurg et al. | 381/151 |
| 5,654,677 A | * | 8/1997 | Dent | 331/111 |
| 5,949,892 A | * | 9/1999 | Stewart | 381/113 |
| 6,067,363 A | * | 5/2000 | Dent | 381/113 |

\* cited by examiner

AUDIO A/D CONVERTER USING FREQUENCY MODULATION

This application is a continuation, divisional of application Ser. No. 08/657,388, filed Jun. 3, 1996.

BACKGROUND

The present invention relates generally to reducing the cost of electronic systems that involve voice processing, such as telephones or cellular phones, by integrating various electronics into a single silicon chip. More particularly, the present invention relates to analog-to-digital convertors that minimize a number of analog components used therein and which furthermore is relatively immune to noise pick-up from digital circuits operating in the same chip.

Many forms of conventional analog-to-digital convertors exist, for example those known by the types of techniques used therein such as Successive Approximation, Delta-Sigma Modulation, and Continuously Variable Slope Delta Modulation (CVSD). The purpose of these devices is to produce a stream of numbers representing samples of the instantaneous signal value at a desired sample rate. The desired sampling rate is usually higher than the minimum Nyquist rate of twice the maximum frequency of the analog signal to be numerically represented. The drawbacks of these prior art techniques concerns the very small signal level output from the microphone, which results in the connection between the microphone and the analog-to-digital convertor being sensitive to noise pick-up.

SUMMARY

According to the exemplary embodiments, a variable frequency oscillator is controlled in frequency by a variable electrical parameter in a microphone, typically a variable capacitance. The frequency modulated signal is applied to a direct digital discriminator that produces a digital representation of the instantaneous frequency at the desired speech sampling rate. The digital discriminator may be formed, for example, by applying the oscillator signal to a direct phase digitizing circuit along with a reference frequency and calculating a sequence of instantaneous phases of the oscillator relative to the reference frequency. The phase sequence is then applied to a digital phase locked loop (or otherwise numerically differentiated) to generate a sequence of binary words representative of instantaneous frequency and therefore representative of the speech waveform. Since the low-level speech waveform substantially does not enter the integrated circuit except as a high-level frequency-modulated carrier, the technique is substantially immune to noise caused by high speed random logic circuits such as microprocessors and DSPs operating on the chip.

According to other exemplary embodiments of the present invention, microphone circuitry still based on the variable electrical parameter of voltage or current can be provided which is less susceptible to noise than conventional microphone circuitry. For example, conventional FET preamplifiers can be omitted according to the invention so that noise typically created by bias supplies is avoided.

BRIEF DESCRIPTION OF THE DRAWINGS

These features and advantages of Applicant's invention will be more readily understood by reading the following detailed description in conjunction with the drawings, in which:

FIG. 28(*b*) illustrates an electret microphone which controls an oscillator according to an exemplary embodiment of the present invention;

DETAILED DESCRIPTION

U.S. Pat. No. 5,084,669, which is incorporated here by reference, describes techniques for determining the instantaneous phase and frequency of a phase or frequency modulated radio signal as a series of numerical values at a desired sample rate using digital logic. U.S. Pat. No. 5,220,275 to Holmqvist, which is also incorporated here by reference, describes a method of determining the instantaneous phase of a signal as a numerical value computed at a desired sample rate. These digital phase/frequency determining circuits are disclosed in these patents for demodulating a modulated radio signal received by a radio receiver. The present invention employs these types of circuits in a new application for digitizing a speech signal by first converting the speech signal to a frequency modulated carrier wave and then employing digital discriminator circuits to convert the modulated carrier wave signal to a train of numerical samples representative of the speech waveform.

Figure 1:
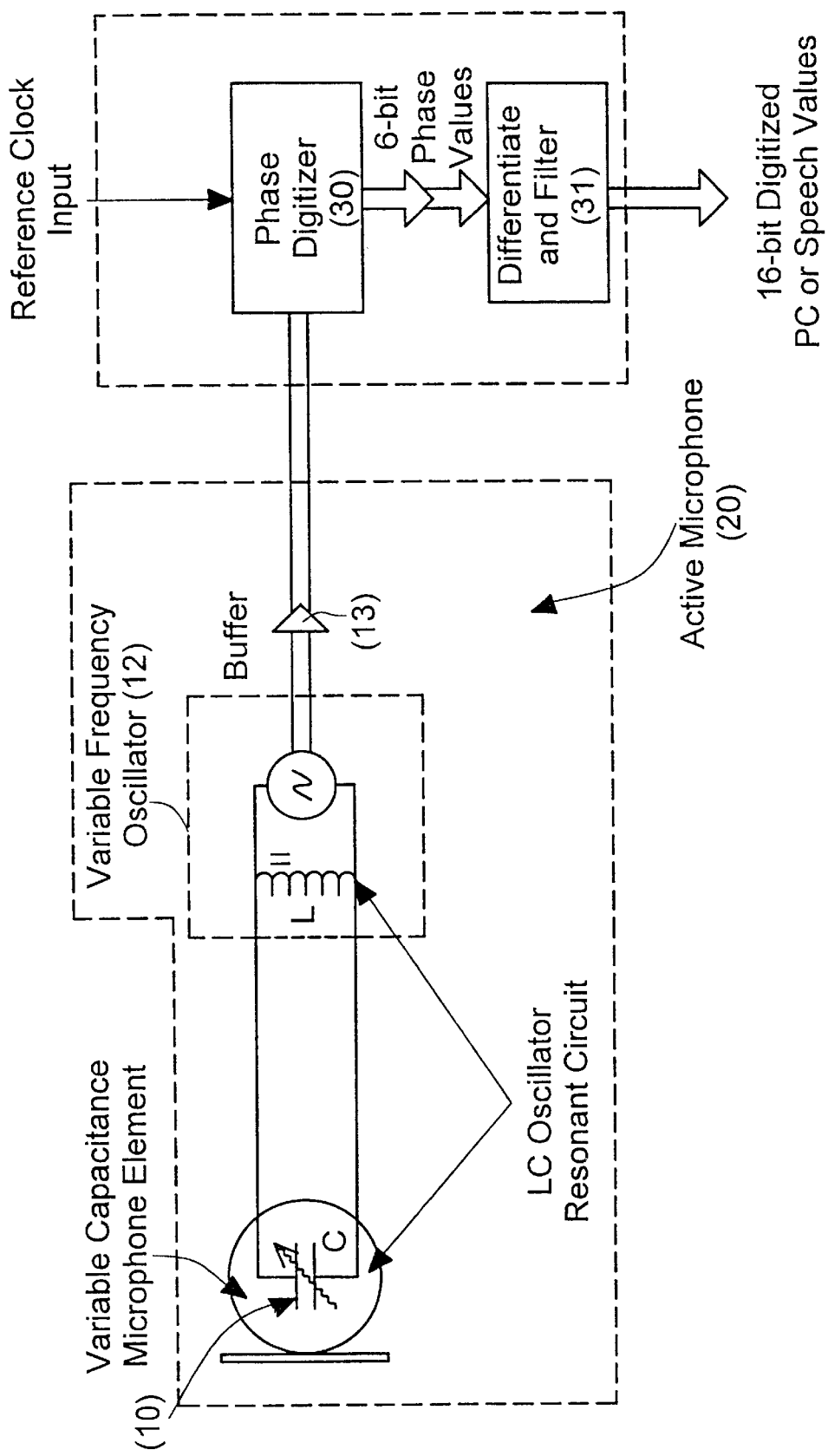
FIG. 1 is a block diagram of a digital speech processing circuit according to an exemplary embodiment of the present invention.

A first exemplary embodiment of the invention is described with the aid of FIG. 1. Therein, an active microphone 20 includes a variable capacitance microphone element 10 forming part of LC resonant circuit 11 of an oscillator 12. The oscillator output signal may be at a frequency of 1 MHz, for example, and preferably output from active microphone 20 as a balanced signal from buffer amplifier 13. The use of balanced signal outputs whereby antiphase signals are run on parallel conductor tracks on a printed circuit board minimizes coupling to other nearby circuits, reducing the risk of causing interference and reducing interference susceptibility. Acoustic speech waveforms are translated into diaphragm movements of microphone element 10 and hence into capacitance variations and then oscillator frequency variations. The speech waveform thus frequency modulates the oscillator signal and the F.M. signal is fed to a direct phase digitizer 30 such as is disclosed in the above-incorporated patents. Phase digitizer 30 compares both positive and negative going transitions of the F.M. carrier signal with a reference clock and quantizes the time of occurrence of those transitions to an accuracy of, for example, half of a clock period. The numerical result from circuit 30 is, for example, a 6-bit binary value representing instantaneous phase at an output sample rate that is a large factor higher than the final desired speech sampling rate of 8 KHz. For example, the sampling rate may be 32 times higher, at 256K samples/second. The sampling rate should in any case be sufficiently high that the instantaneous phase deviation of the carrier frequency from a nominal phase cannot change by more than +/−180 degrees (i.e., a half cycle) during one sample period. That is to say the sample rate should be at least twice the maximum frequency deviation from the nominal carrier frequency produced by the speech-induced diaphragm vibrations. This is desirable because a greater than 180 degree phase value cannot be distinguished from a negative phase value of less than 180 degrees, and vice-versa. Preferably the phase change over one sample period should be less than +/−90 degrees to provide the greatest margin for discriminating positive from negative phase changes and avoiding the ambiguous region around +/−180 degrees.

The phase samples from phase digitizer 30 are fed to a numerical differentiator 31 that computes differences modulo 2Pi between successive samples. By virtue of the afore-described preferential relationship between sample rate and maximum frequency deviation, the phase difference will lie within the range +/−90 degrees. The difference will thus nominally have the same word length as the original phase sample. For example, if phase is computed to 6-bit accuracy, the positive integers 0 to 31 represent angles greater than 0 and less than 180 degrees while the negative integers represent angles less than 0 and greater than −180 degrees. A phase difference nominally between +/−90 degrees is representable therefore by integers between 16 and +16, well within a 6-bit wordlength and allowing headroom for greater peaks.

The 6-bit phase differences at, for example, 256K samples/S are then downsampled to 8K samples/S by a digital low-pass filter. The first stage of such a low-pass filter can, for example, comprise computing the sum of 32 successive samples over a moving window 32-samples wide. This results in 11-bit quantities in this example.

The second stage of filtering can comprise accumulating together 32 successive 11-bit moving averages once per 32-sample block to obtain 16-bit values at a sample rate of 8 K samples/S as required. As disclosed in U.S. patent application Ser. No. 08/120,426 filed on Sep. 14, 1993 to Paul W. Dent which is incorporated here by reference, such downsampling leads to a reduction in frequency response at the highest speech frequency of 3.4 KHz, which may be compensated by resetting the accumulator before each new accumulation to a negative fraction of its previous value.

Assuming the quantizing noise on the phase differences is uniformly distributed in frequency between zero and the Nyquist frequency of 128 KHz, the downsampling filter reduces the quantizing noise power by the 32:1 bandwidth reduction factor, which is equivalent to 2.5 bits of precision and so the equivalent precision of this method is only 8.5 bits and not equal to the 16-bit length of the calculated values. The quantizing noise spectrum is however uniform in the phase domain, but since phase is differentiated to perform frequency demodulation, the spectrum would be expected to be rising at 6 dB per octave of frequency, and thus to have less noise at lower frequencies than higher frequencies. In this way, the majority of the quantizing noise power would be expected to cluster up towards half the sampling rate and the amount falling in the 0–3.4 KHz audio band to be significantly reduced.

Figure 2:
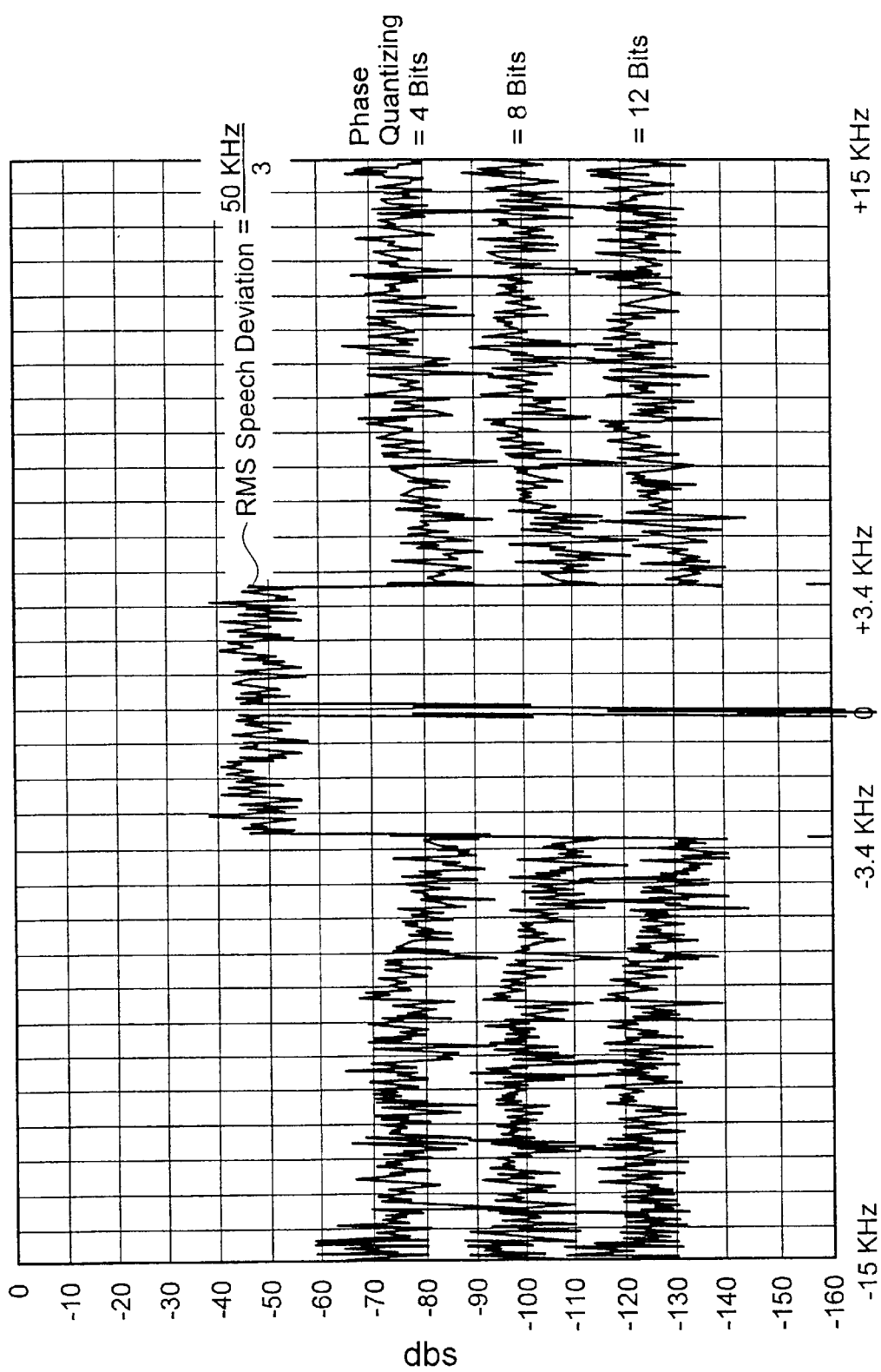
FIG. 2 is a graph illustrating an exemplary speech frequency spectrum prior to downsampling for three exemplary quantization precisions.

FIG. 2 shows the spectrum before downsampling of the phase differences. The wanted signal modulation is a white noise signal with a spectrum extending from 200 Hz to 3.4 KHz representing speech, and is adjusted to produce an RMS frequency deviation of ⅓rd of a 50 KHz peak deviation, chosen to be less than ¼ of the 240 KHz sample rate for the reasons explained above. This ensures that the 3-sigma limits of the noise-like wanted signal are kept within the peak deviation. The spectrum of FIG. 2 shows the quantizing noise outside the 3.4 KHz range that will be removed by the downsampling filter, for various phase quantization accuracies in bits. Thus, the tendency for the quantizing noise spectrum to fall towards zero frequency as predicted above is confirmed. However, the quantizing noise within the 3.4 KHz range cannot be seen in FIG. 2 as this is masked by the signal spectrum. Other Figures will be discussed later that show the quantizing noise within the audio band by subtracting the wanted signal. FIG. 2 shows a band-edge quantizing noise density that is below the signal spectral density by the following amounts.

| PHASE QUANTIZING | 4-bit | 8-bit | 12-bit |
|---|---|---|---|
| BAND-EDGE N/S DENSITY | −35 dB | −60 dB | −85 dB |

These values follow the expected law of 6 dB improvement per bit of quantizing accuracy, i.e., 24 dB per 4-bits.

Assuming for the moment that the in-band noise falls off towards zero frequency at 6 dB per octave, the total noise power can be computed by integration giving a total signal to noise power ratio 3 times (4.77 dB) better than the above figures. The in-band quantizing noise can thus be expressed as an apparent noise frequency deviation in Hz RMS as follows.

| PHASE QUANTIZING | 4-bit | 6-bit | 8-bit | 10-bit | 12-bit |
|---|---|---|---|---|---|
| In-band noise deviation (Hz RMS) | 167 Hz | 43 Hz | 10 Hz | 2.6 Hz | 0.53 Hz |

Figure 3:
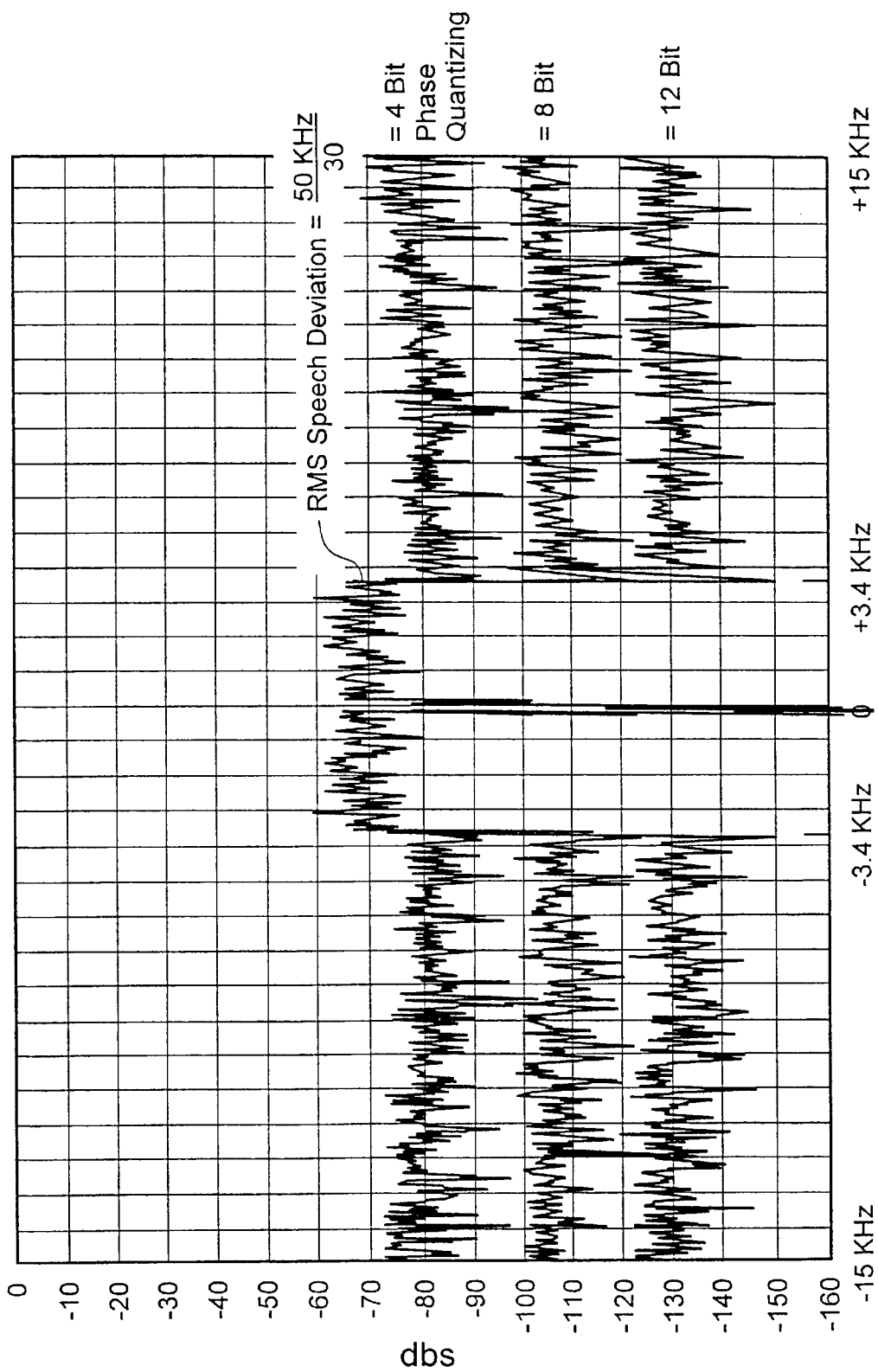
FIGS. 3 and 4 are graphs which illustrate the quantized signal and noise spectrum during quiet periods.
Figure 4:
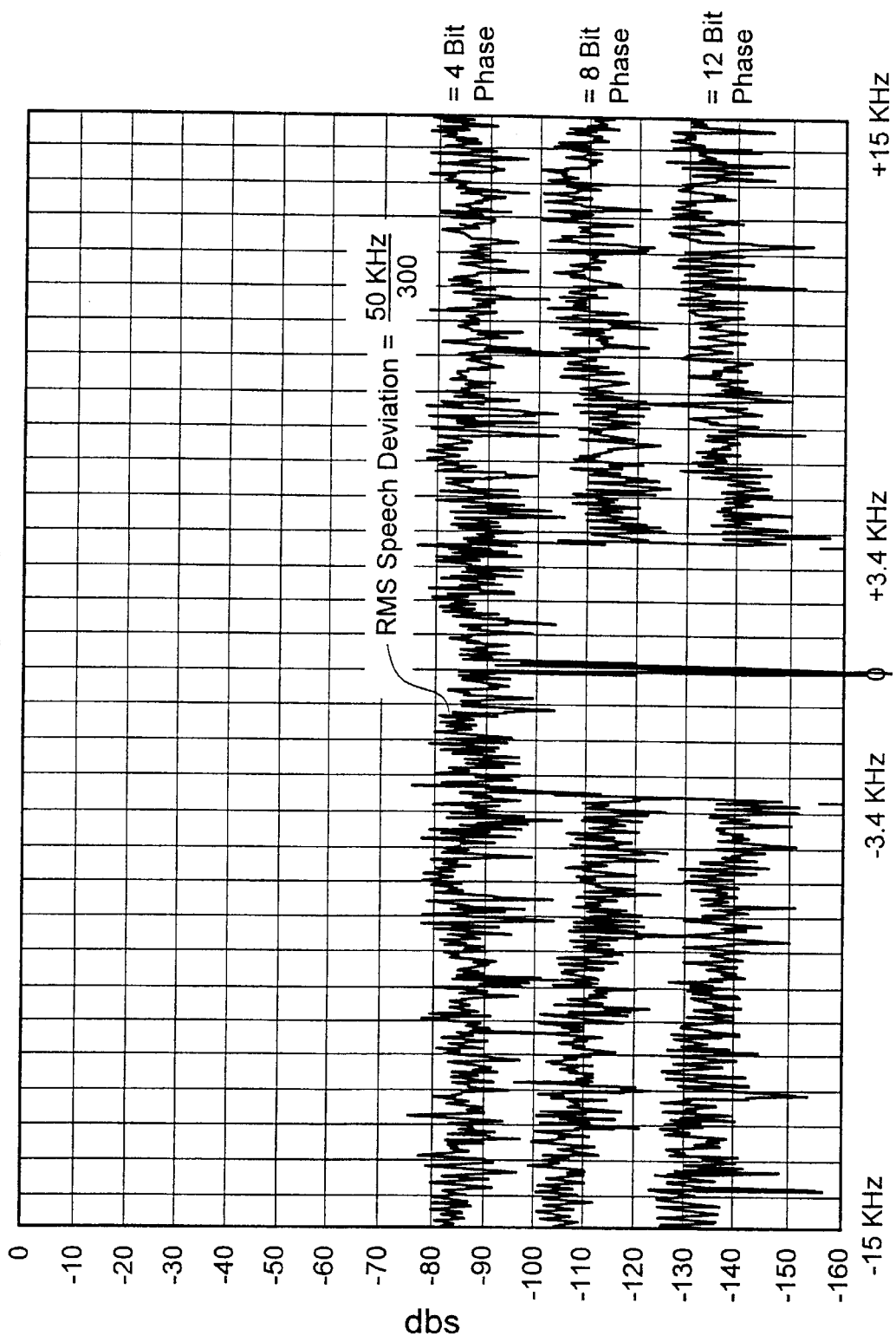
Figure 5:
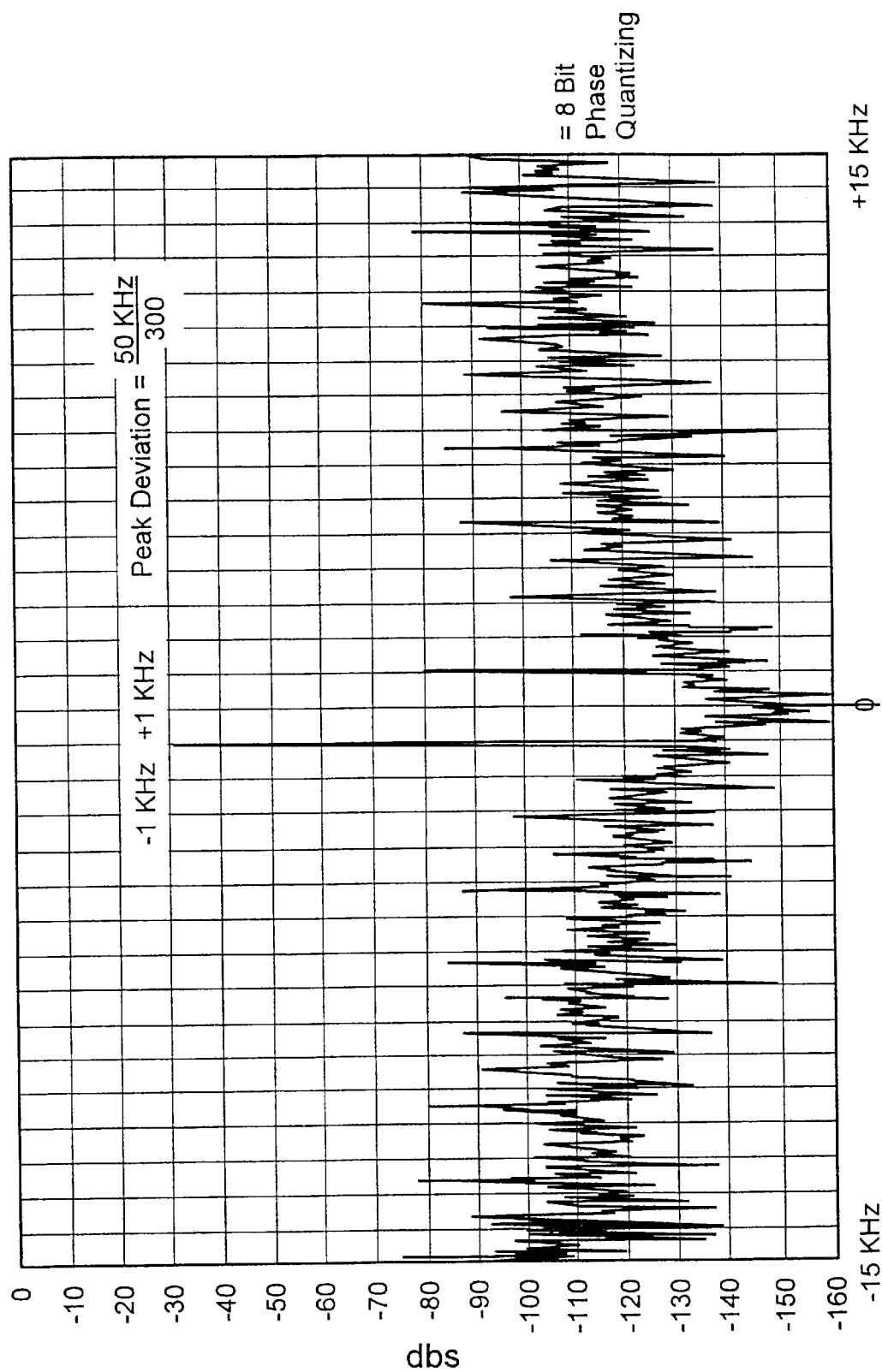
FIGS. 5 and 6 are graphs which illustrate the quantized signal and noise spectrum using a 1 KHz sine wave test.
Figure 6:
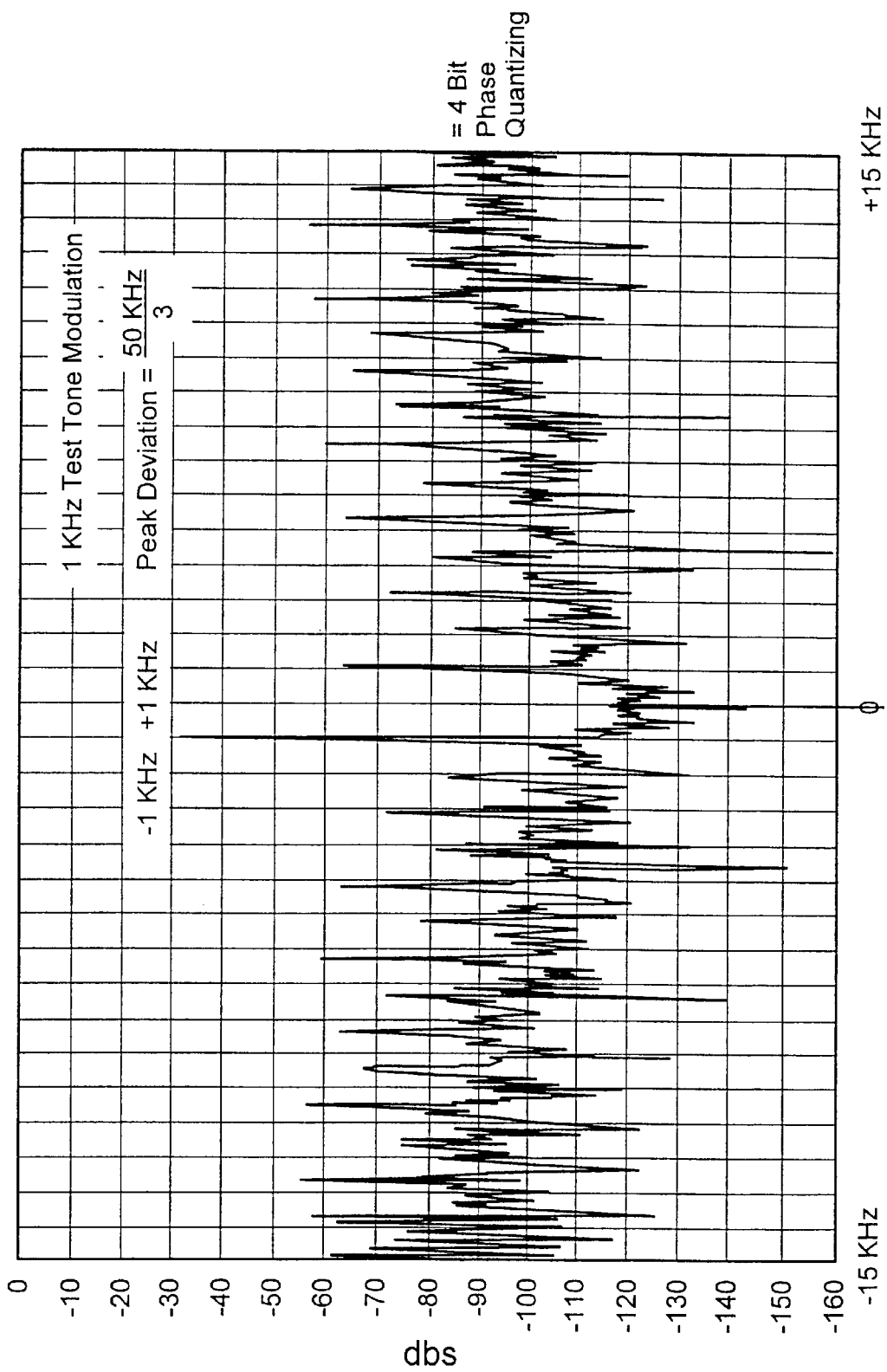
Figure 7:
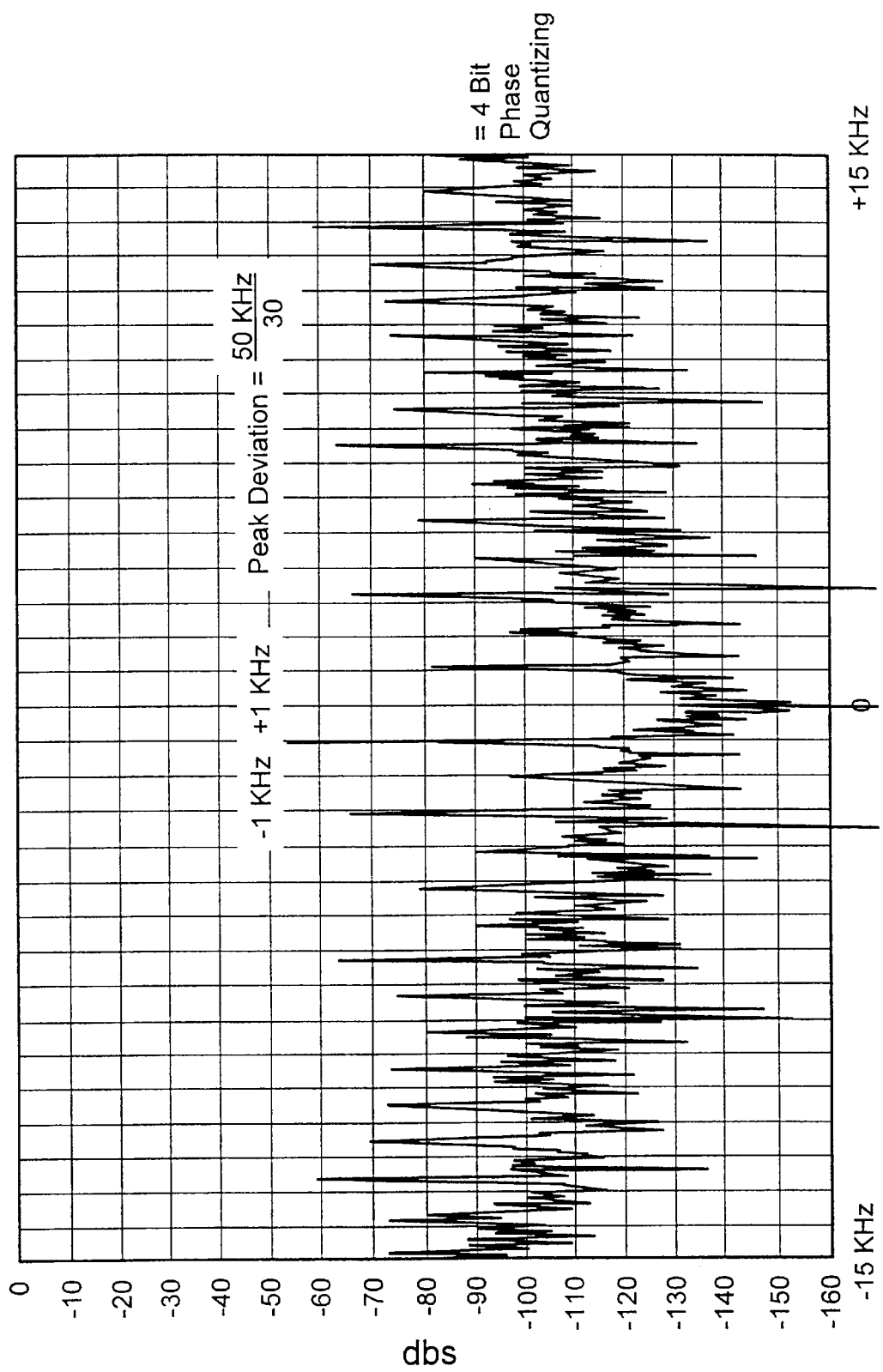
FIG. 7 is a graph which illustrates harmonic distortion for quiet period signals.

Speech quality is generally considered to be more related to noise in speech pauses than to noise on speech peaks. FIGS. 3 and 4 show the quantized signal+noise spectrum with speech modulation reduced 20 and 40 dB, respectively. A tendency may be noted in these Figures for the quantizing noise at the 3.4 KHz band edge to reduce with reduced signal power, which is a favorable tendency, but also there is a tendency for the spectrum to become flat, which is not so favorable. It may be shown that the greater proportion of the noise falling in the lower frequency part of the spectrum is caused by it being the signal itself which drives the phase through its quantizing levels. With lower signal excursions, the quantizing levels are crossed at a lower rate, so that the quantizing noise spectrum has more energy at low frequency. With sine-wave signals moreover, the quantizing noise will appear at harmonics of the signal frequency, as level-crossings will occur at regularly defined points on the signal waveform. This is confirmed by FIGS. 5 and 6 which show an exemplary signal plus quantizing noise spectrum using a 1 KHz sine-wave test signal, with 8- and 4-bit phase-quantizing, respectively. Because quantizing levels are symmetrically disposed in the phase plane, odd harmonics dominate, and the 3rd harmonic is around 66 dB down on the fundamental with 8-bit quantizing and 40 dB down with 4-bit quantizing. However, the relative 3rd harmonic distortion increases as the signal is reduced as shown in FIG. 7, where 3rd harmonic rises to only 14 dB below a 20 dB reduced signal level.

Figure 8:
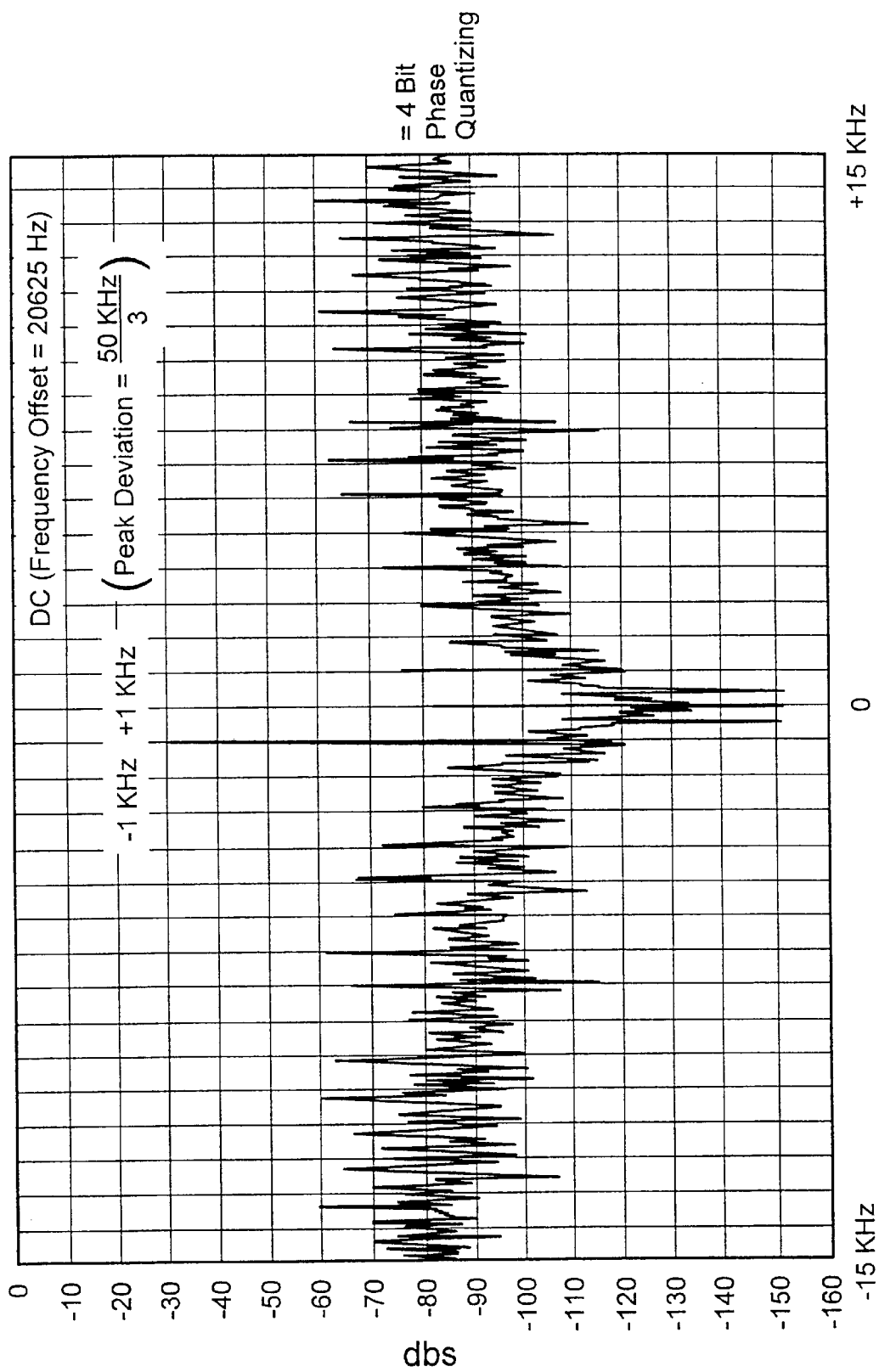
FIG. 8 is a graph which illustrates the reduction of harmonic distortion by introduction of a deliberate frequency offset according to the present invention.
Figure 9:
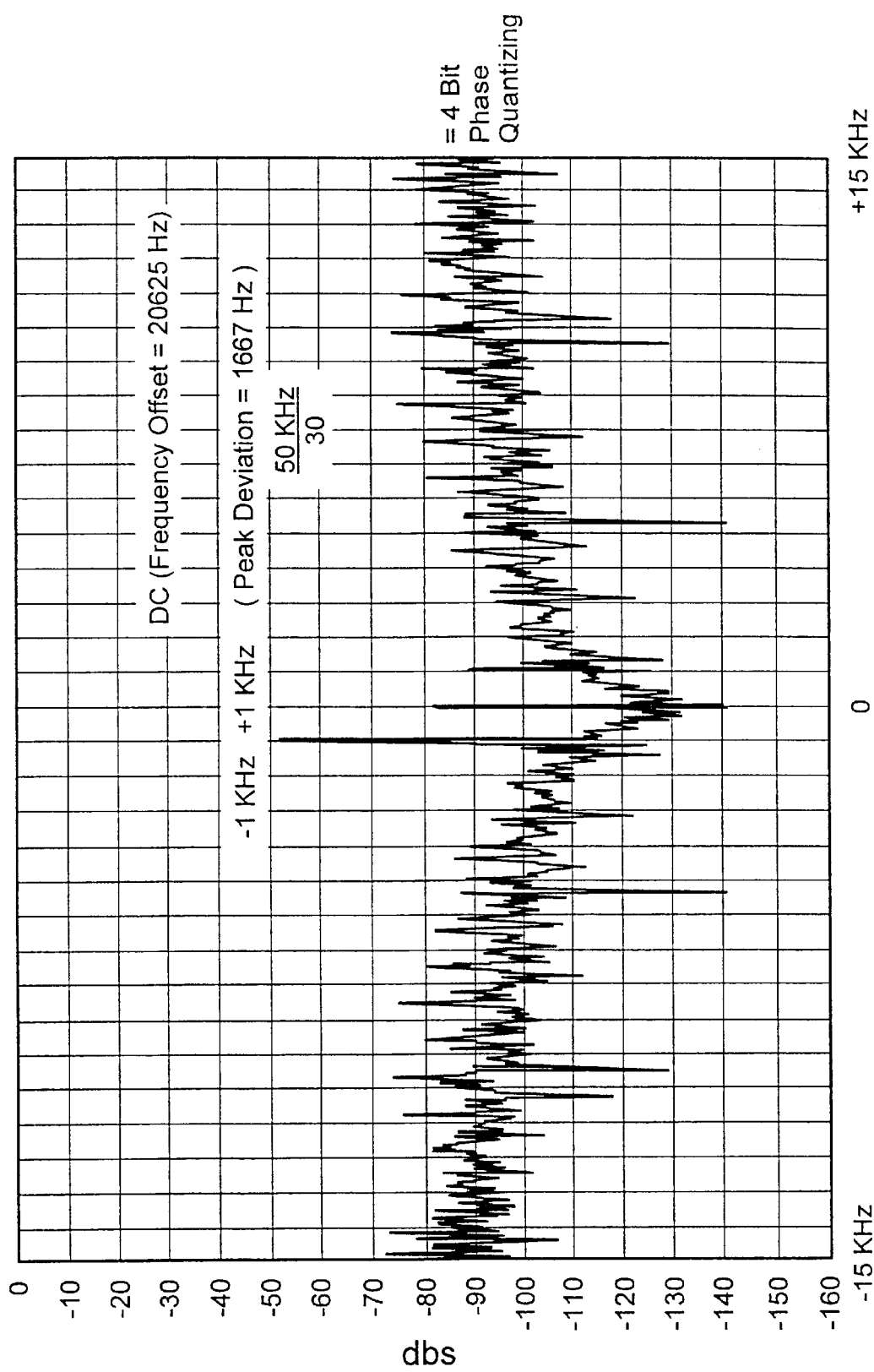
FIGS. 9–11 are graphs which illustrate that harmonic distortion decreases when the signal level is reduced if a deliberate frequency offset if applied according to the present invention.
Figure 10:
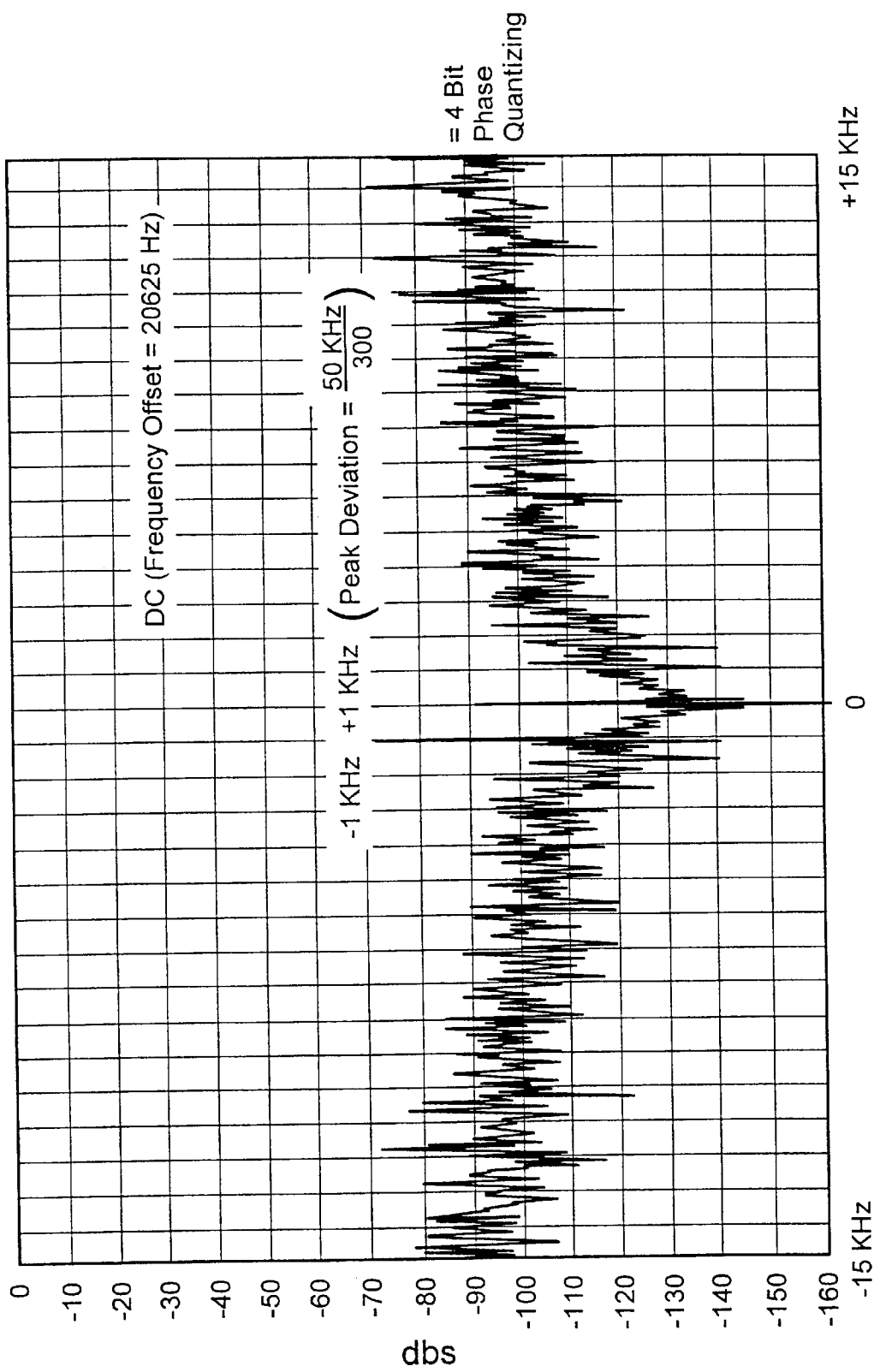
Figure 11:
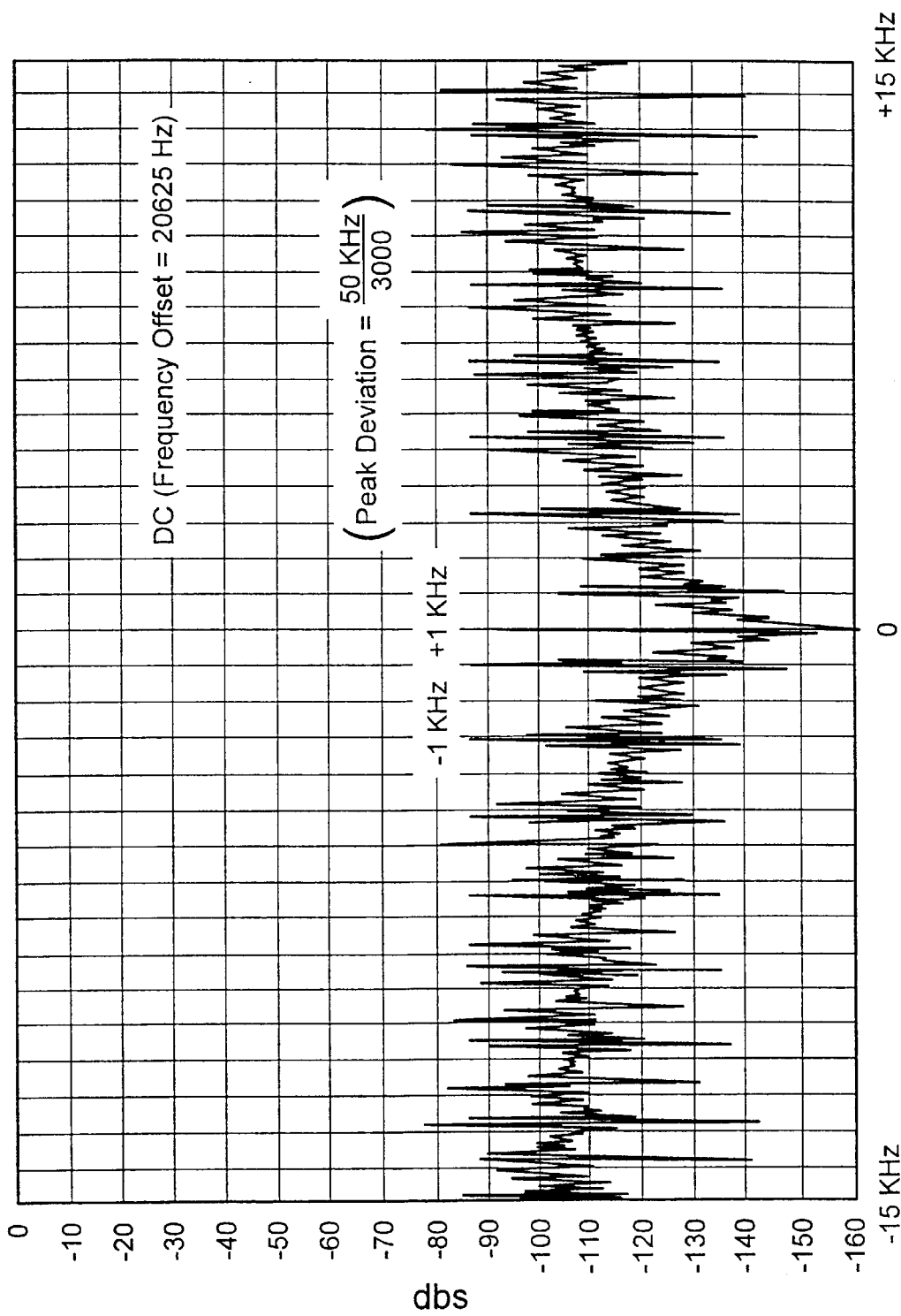

These effects may be substantially alleviated by use of a deliberate carrier frequency offset such that the signal phase rotates rapidly through all the quantizing levels even in the absence of speech modulation. For example, FIG. 8 shows an exemplary spectrum wherein a 20,625 Hz carrier frequency offset is employed. This particular carrier frequency value is not critical and was chosen to facilitate the computation of the spectrum by giving a phase waveform that repeated in a finite number of 4096 time samples at 240K samples/sec. Thus, those skilled in the art will appreciate that any carrier frequency offset can be applied, however the offset should be chosen high enough so that systematic quantizing step changes occur at greater than the maximum audio frequencies. It may be seen that the third harmonic with 4-bit phase quantizing has dropped from −40 dB to nearly 50 dB below the fundamental. Now when the signal deviation is reduced, as shown in FIG. 9, the harmonic distortion does not increase but in fact decreases, and is still in the −40 dB to −50 dB region with a 20 dB reduced signal. FIG. 10 shows that even with a 40 dB reduced signal, noise and distortion products are still 25 dB down. FIG. 11 shows that odd harmonics appear equal to the signal when the signal power is reduced by 60 dB. FIGS. 5 to 11 all confirm that the quantizing noise spectrum falls off towards zero frequency.

Figure 12:
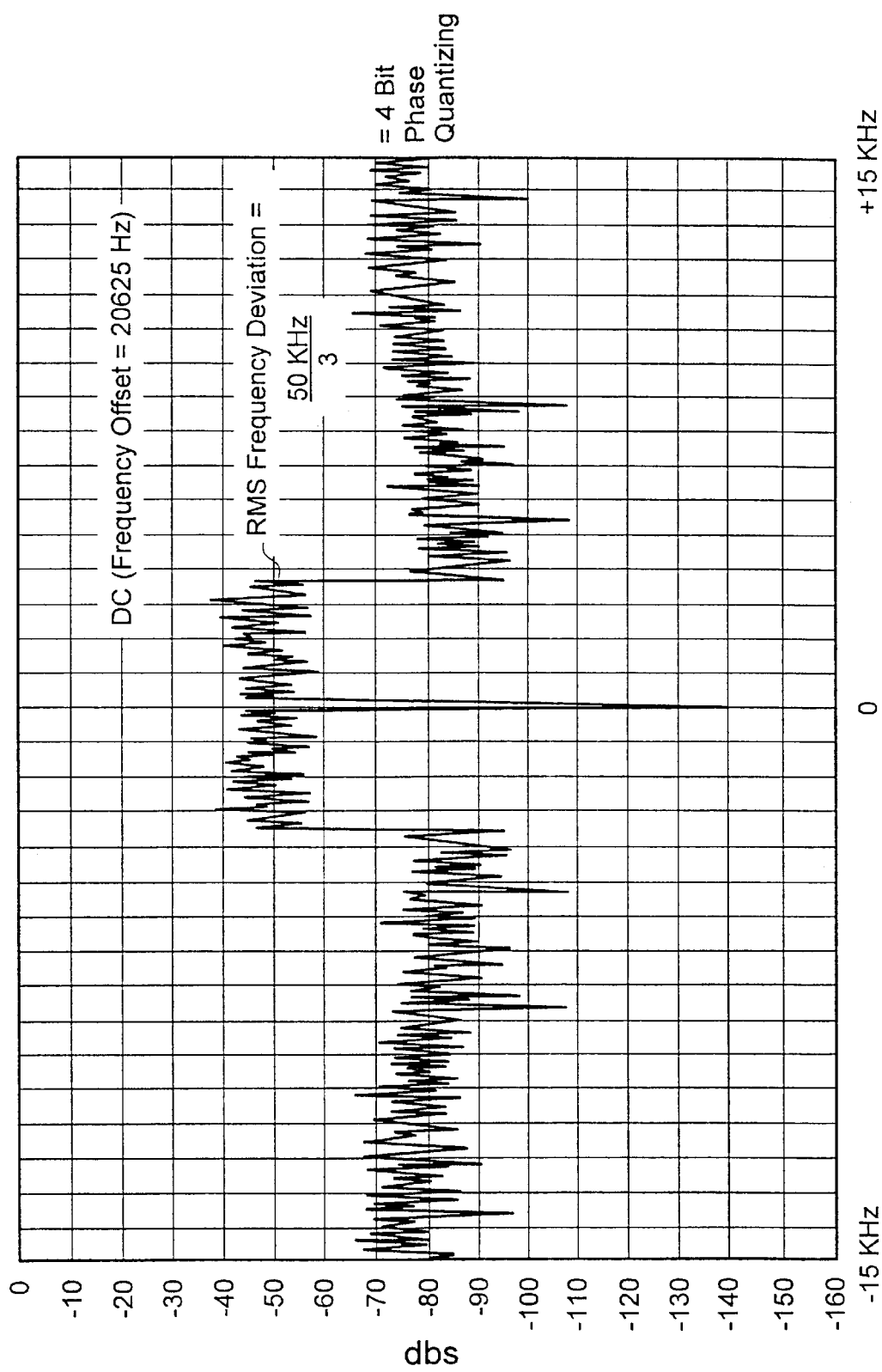
FIG. 12 is a graph which illustrates the spectrum of a noise-like test signal to which a deliberate frequency offset has been introduced.
Figure 13:
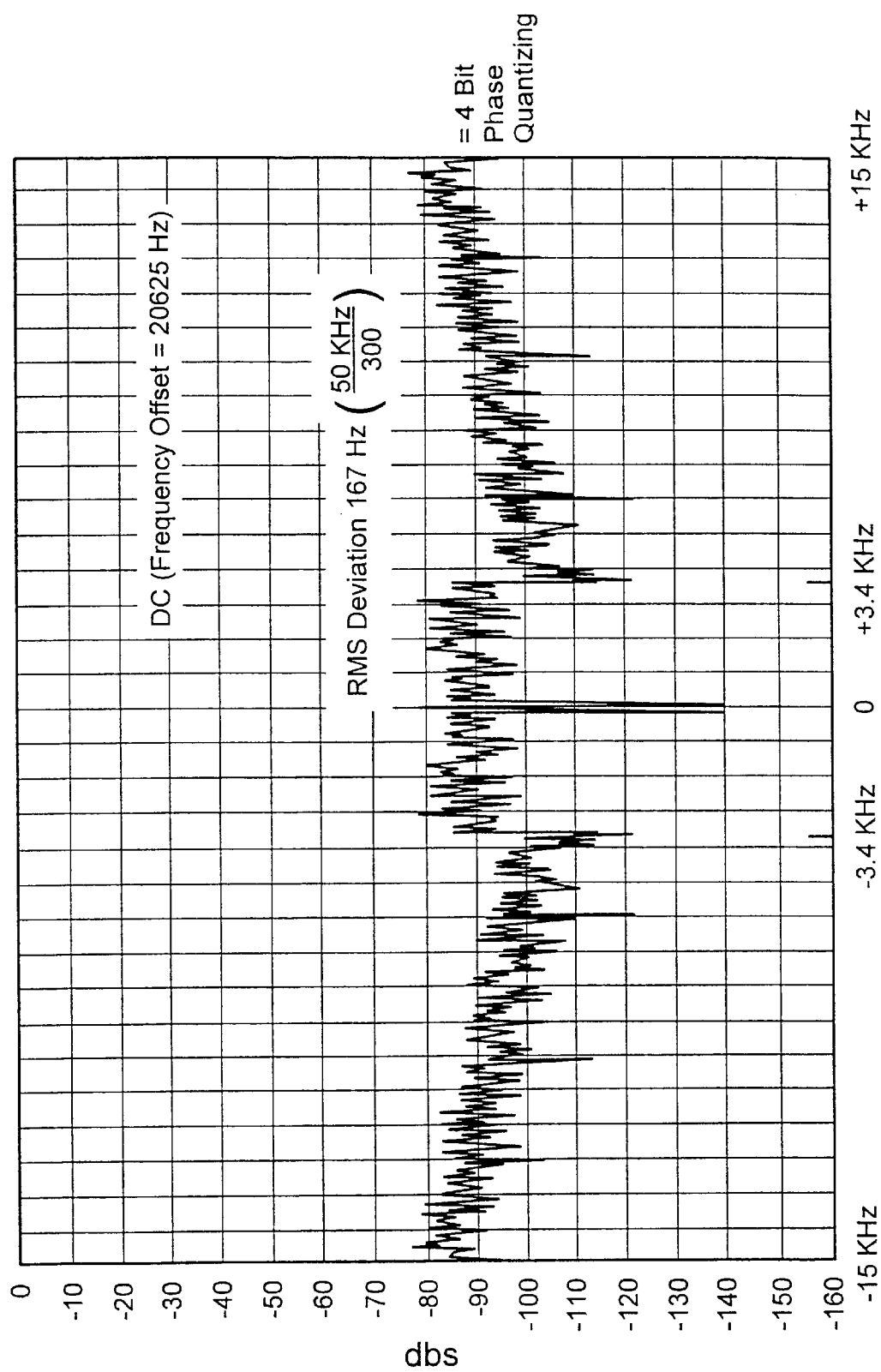
FIG. 13 is a graph illustrating a reduced signal level version of the test signal of FIG. 12.
Figure 14:
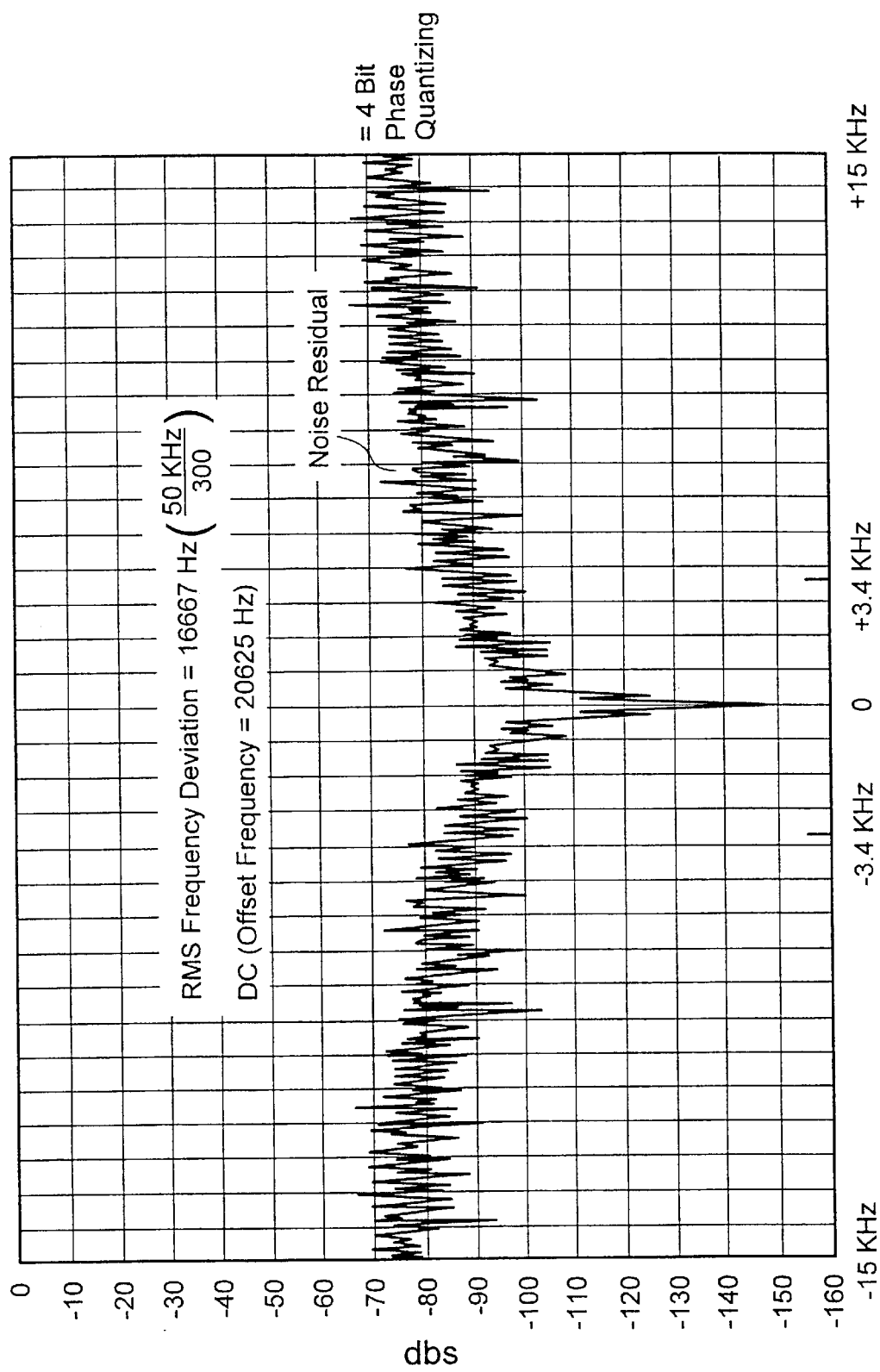
FIGS. 14 and 15 are graphs which illustrate residual quantizing noise residually after subtraction of the desired signal from the frequency spectrum.
Figure 15:
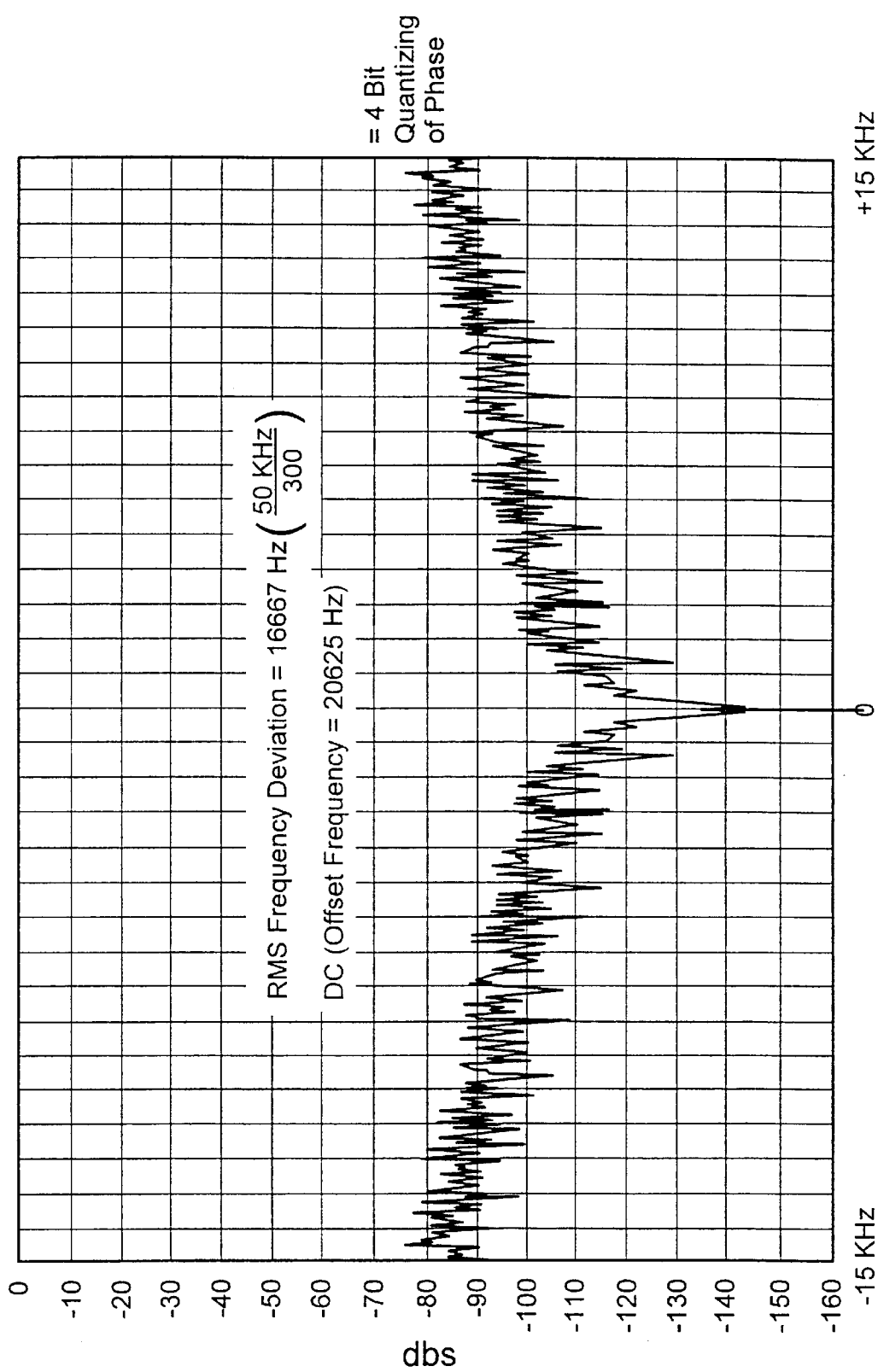

FIGS. 12 and 13 show the noise-like test signal using the deliberate frequency offset. Full test signal deviation is employed in FIG. 12 and gives a quantizing noise spectrum with 4-bit phase quantizing that is similar to the 4-bit quantized spectrum of FIG. 2 without a frequency offset. FIG. 13 however shows that, when the signal is reduced 40 dB, the noise spectrum now drops about 15 dB, in contrast to FIG. 4, which did not use frequency offset according to the present invention. FIGS. 14 and 15 show the in-band quantizing noise for full signal and 40 dB reduced signal respectively, having subtracted the wanted signal to unmask the residual noise. The noise spectrum is confirmed to fall off towards zero frequency and to be lower by 10–15 dB during a −40 dB speech pause (FIG. 15) compared to full speech activity (FIG. 14).

Figure 16:
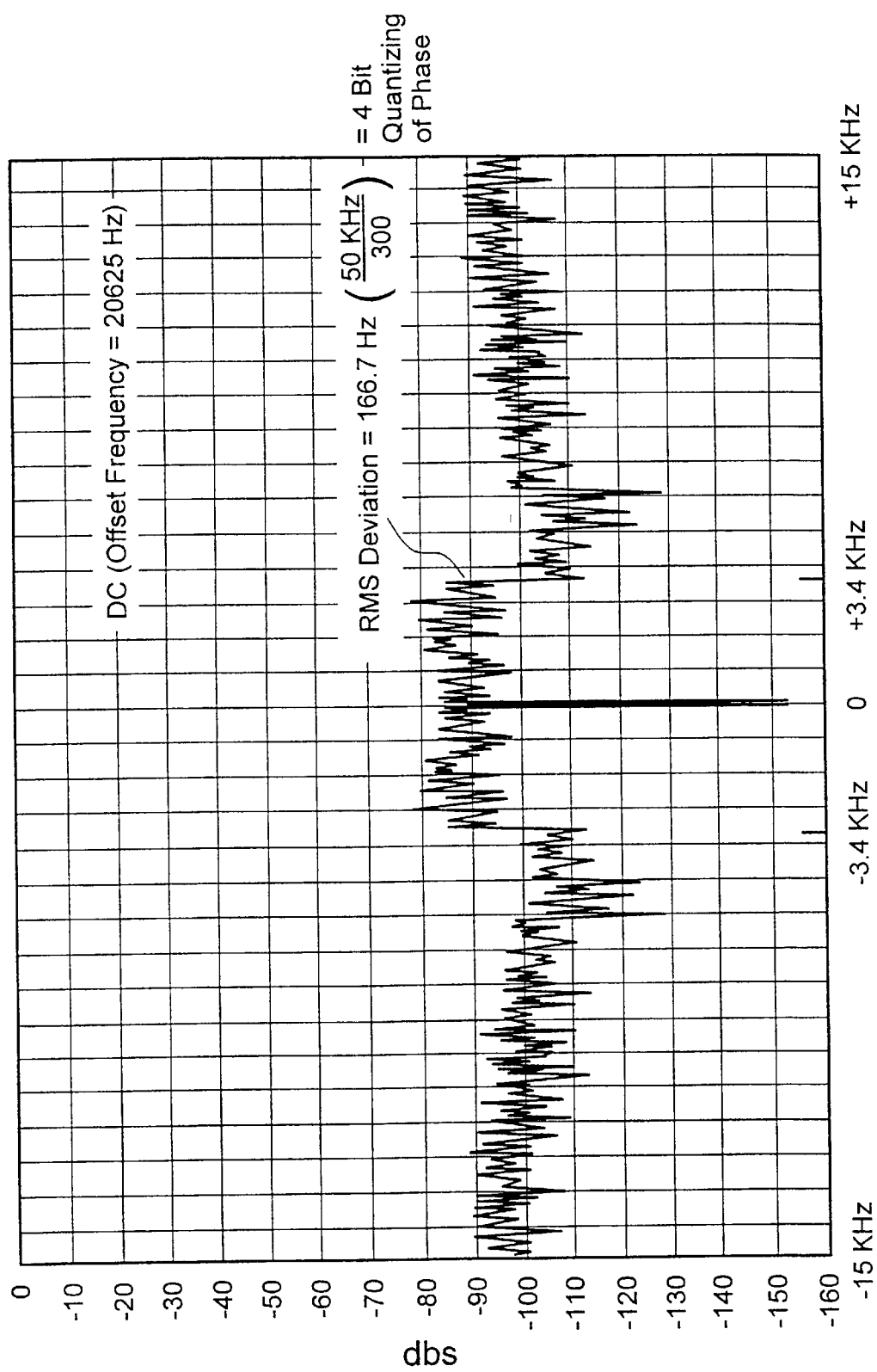
FIGS. 16 and 17 are graphs which illustrate a speech pause in a signal using six-bit quantizing and residual noise therein, respectively, for a signal to which a frequency offset has been applied.
Figure 17:
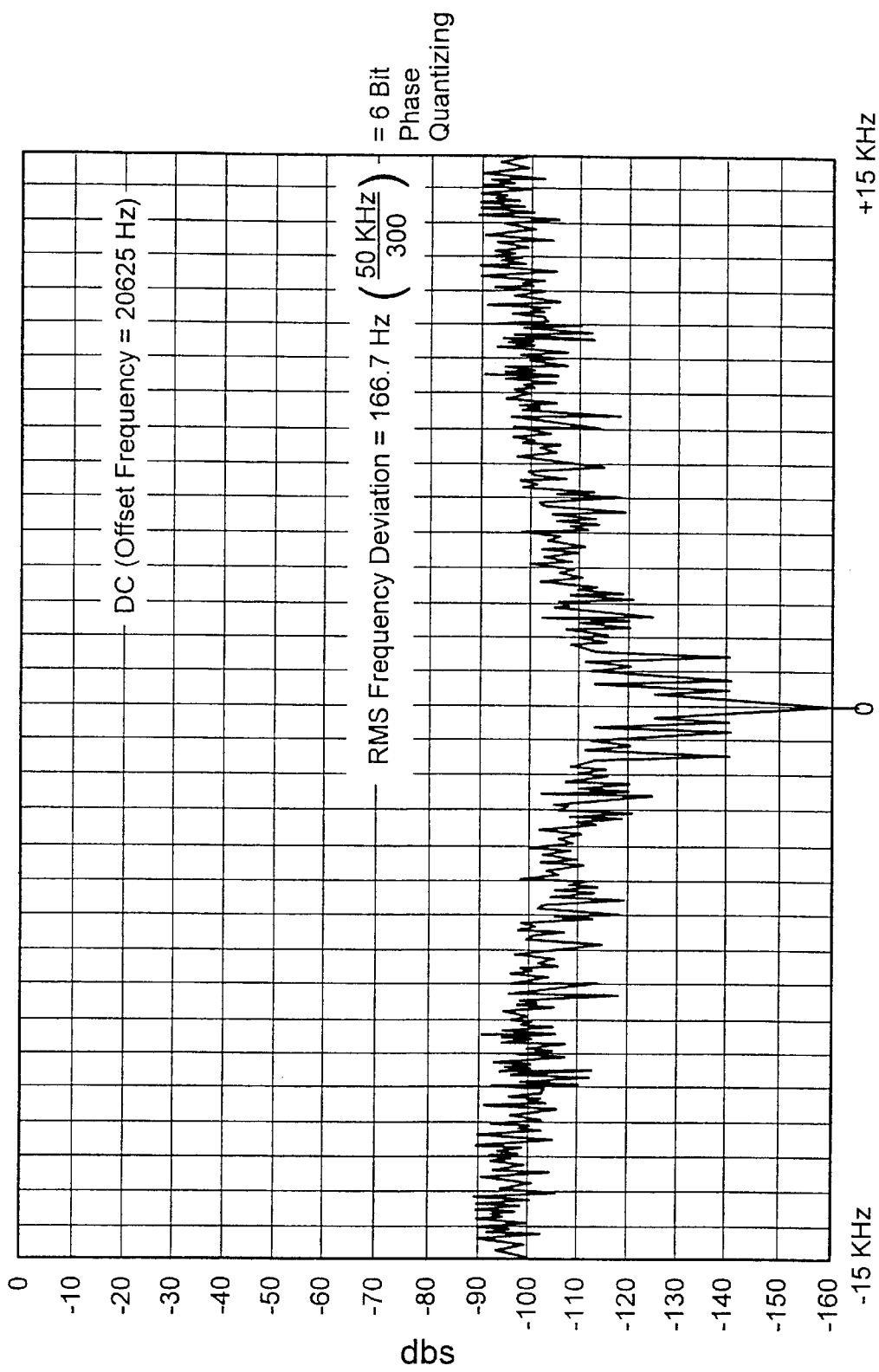

FIGS. 16 and 17 show respectively the signal+noise and residual noise spectrum during a −40 dB speech pause using 6-bit phase quantizing and a deliberate frequency offset according to an exemplary embodiment of the present invention. The residual noise expressed as an in-band RMS frequency deviation is, in FIG. 17, approximately 10 Hz, i.e., similar to that obtained with 8-bit quantizing without frequency offset (See FIGS. 2, 3).

In terms of A to D performance, exemplary techniques according to the present invention using 6-bit phase quantizing achieve a dynamic range of 100000 units (+/−50 KHz deviation or more) with a quantizing noise of 10 units RMS, i.e., −80 dB relative to the whole dynamic range. A conventional A to D convertor would require 11.5 bits precision to achieve the same performance, or 9-bits to achieve the same performance using the same oversampling factor.

Figure 18:
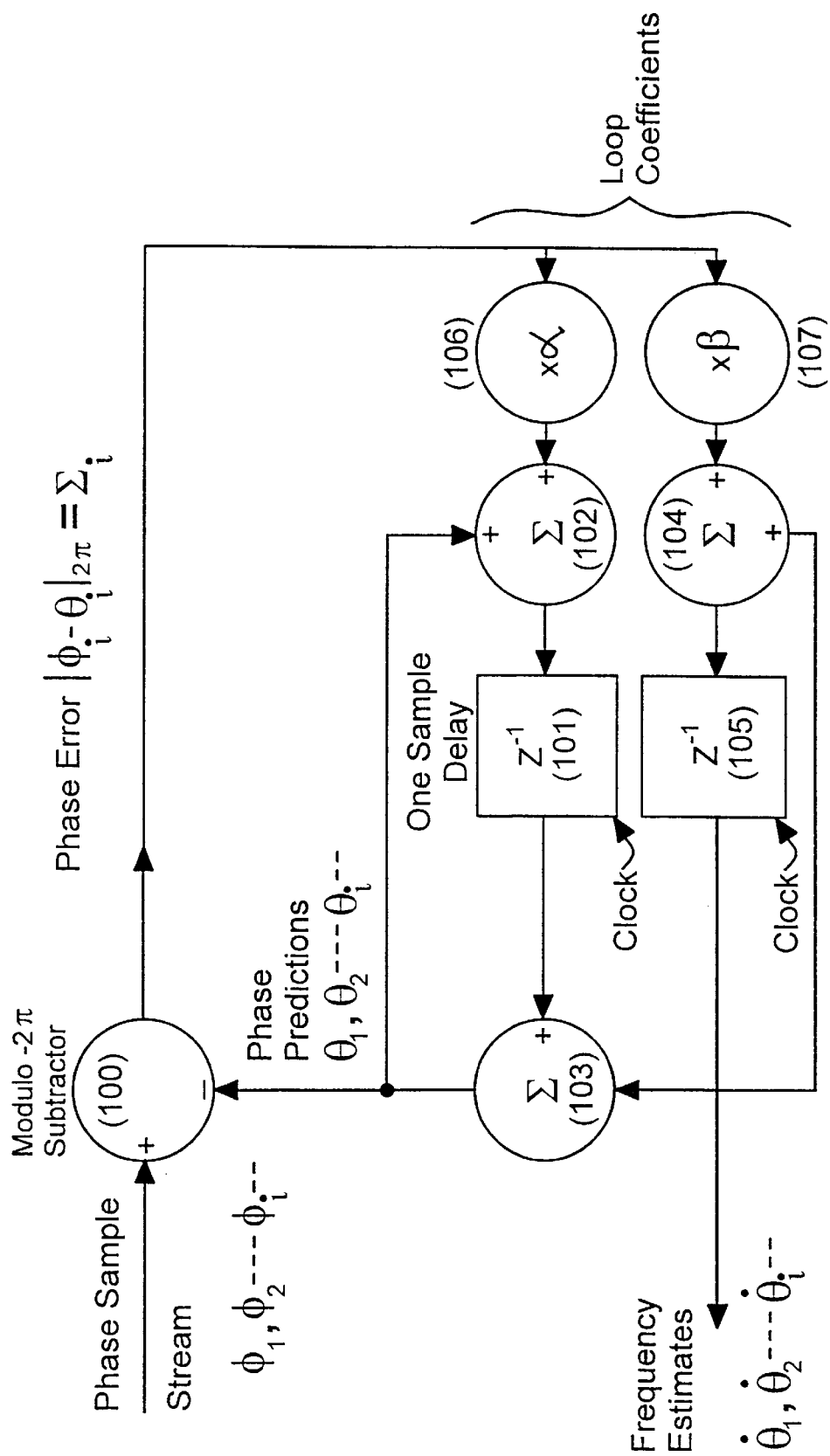
FIG. 18 is a block diagram of a digital phase locked loop which can be used in systems according to the present invention.

An alternative method of converting phase samples to frequency samples according to the present invention is to employ a digital phase-locked loop, as described in U.S. Pat. No. 5,084,669 which was incorporated above by reference. FIG. 18 shows an exemplary form of digital PLL adapted for the present invention. Therein, a stream of digitized phase samples PHI1,PHI2,PHI3 . . . PHIi . . . is input to a phase comparator 100. This comparator subtracts an expected phase THETAi from the actual phase PHII to obtain the error Ei between the estimate and the actual phase. The phase estimate THETAi is computed by combining a previously updated phase value delayed through delay register 101 with a previous frequency estimate delayed through delay register 105 in order to predict the new phase from the old phase by linear extrapolation using the frequency as the slope. Both the frequency and the phase are then updated by adding a fraction BETA of the phase error to the previous frequency estimate and a fraction ALPHA of the phase error to the previous phase estimate.

ALPHA and BETA determine the characteristics of the second order digital phase lock loop so constructed. It is also possible to construct higher order loops using, for example, an estimate of the rate of change of frequency which would be updated using a coefficient GAMMA.

Figure 19:
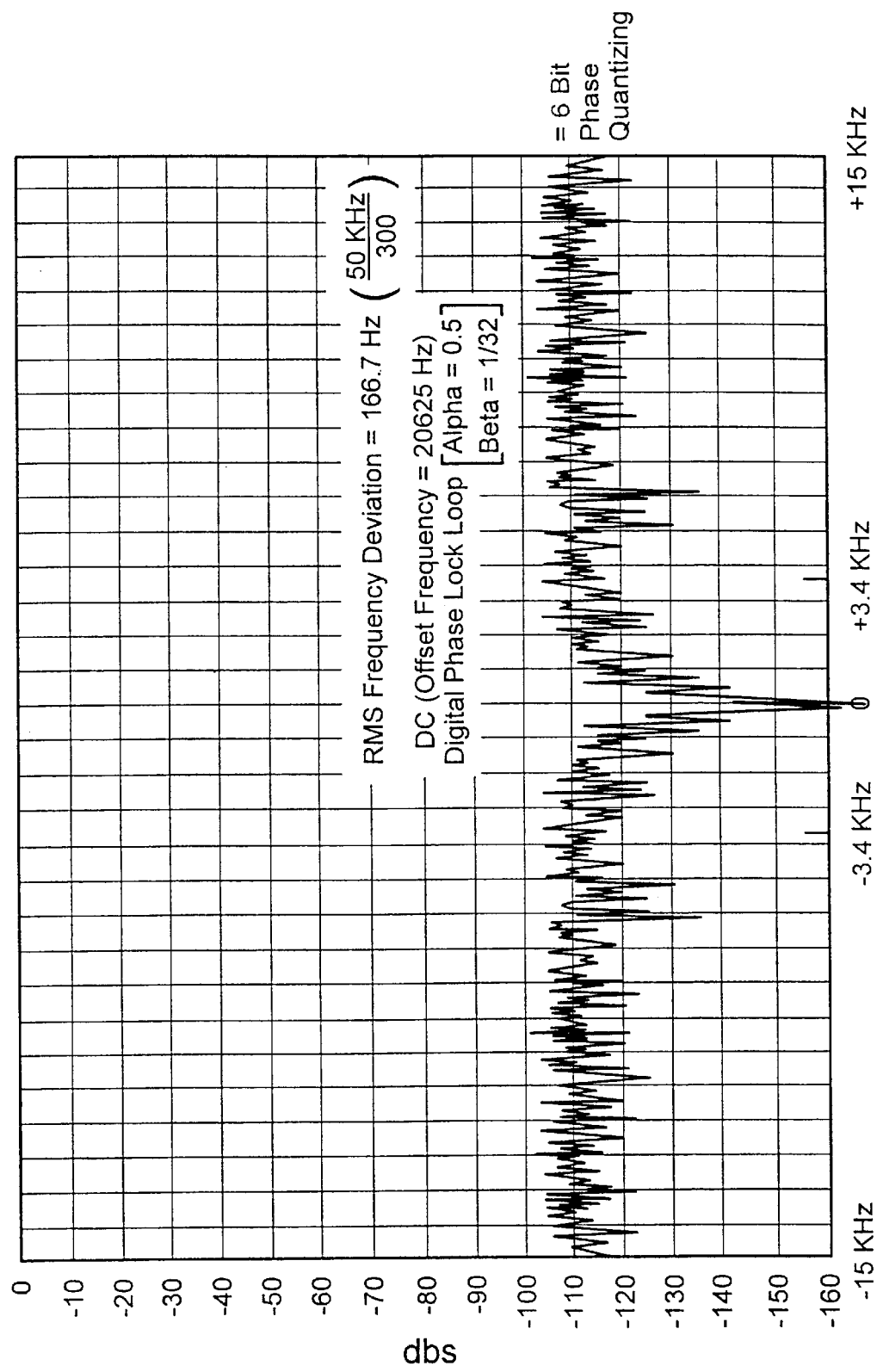
FIG. 19 is a graph illustrating the residual noise spectrum for an exemplary digital phase locked loop with frequency offset introduced according to the present invention.

FIG. 19 shows the residual noise spectrum of the frequency estimates formed by an exemplary digital PLL having coefficients ALPHA=0.5, BETA=1/32. ALPHA and BETA can, for example, be chosen to be inverse powers of two so that multiplication can be effected by a simple shift. By comparing the noise spectrum of FIG. 19 with that of FIG. 17, it can be seen that there is little difference within the audio range of zero to 3.4 KHz, as the loop does not attenuate components in this range. A reduction in quantizing noise density at +/−15 KHz is evident however as the loop has some attenuation at these frequencies.

Figure 20:
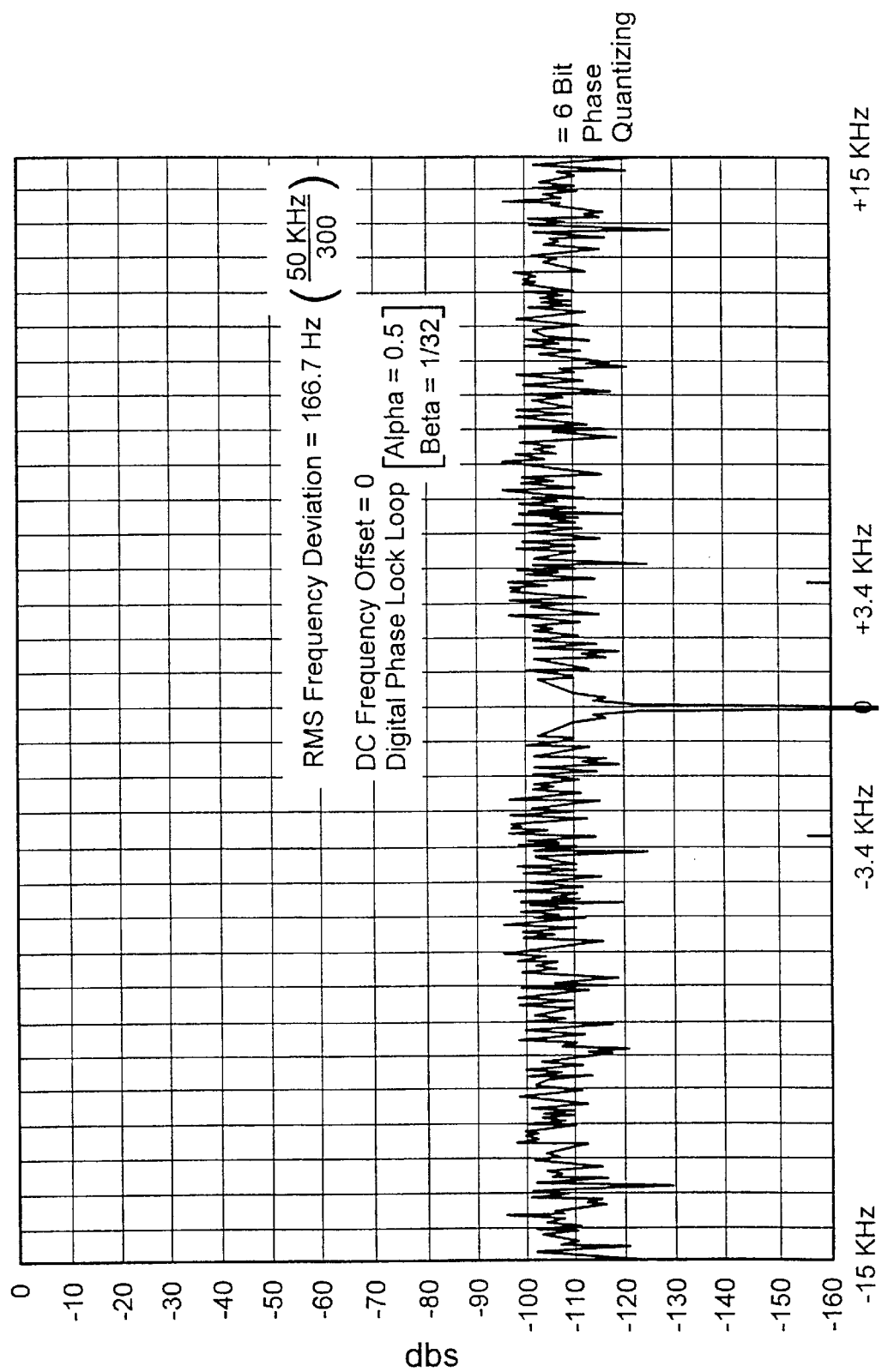
FIG. 20 is a graph which illustrates the residual noise spectrum for a phase locked loop when a frequency offset is not provided.

To demonstrate that the use of a deliberate frequency offset is also valuable in the context of a digital PLL FM demodulator, FIG. 20 shows the residual quantizing noise from the PLL FM demodulator with the frequency offset removed. It can be seen that the quantizing noise within 0–3.4 KHz is 10 dB or more larger, conforming that the benefit of frequency offset is independent of the type of FM demodulator used.

Figure 21:
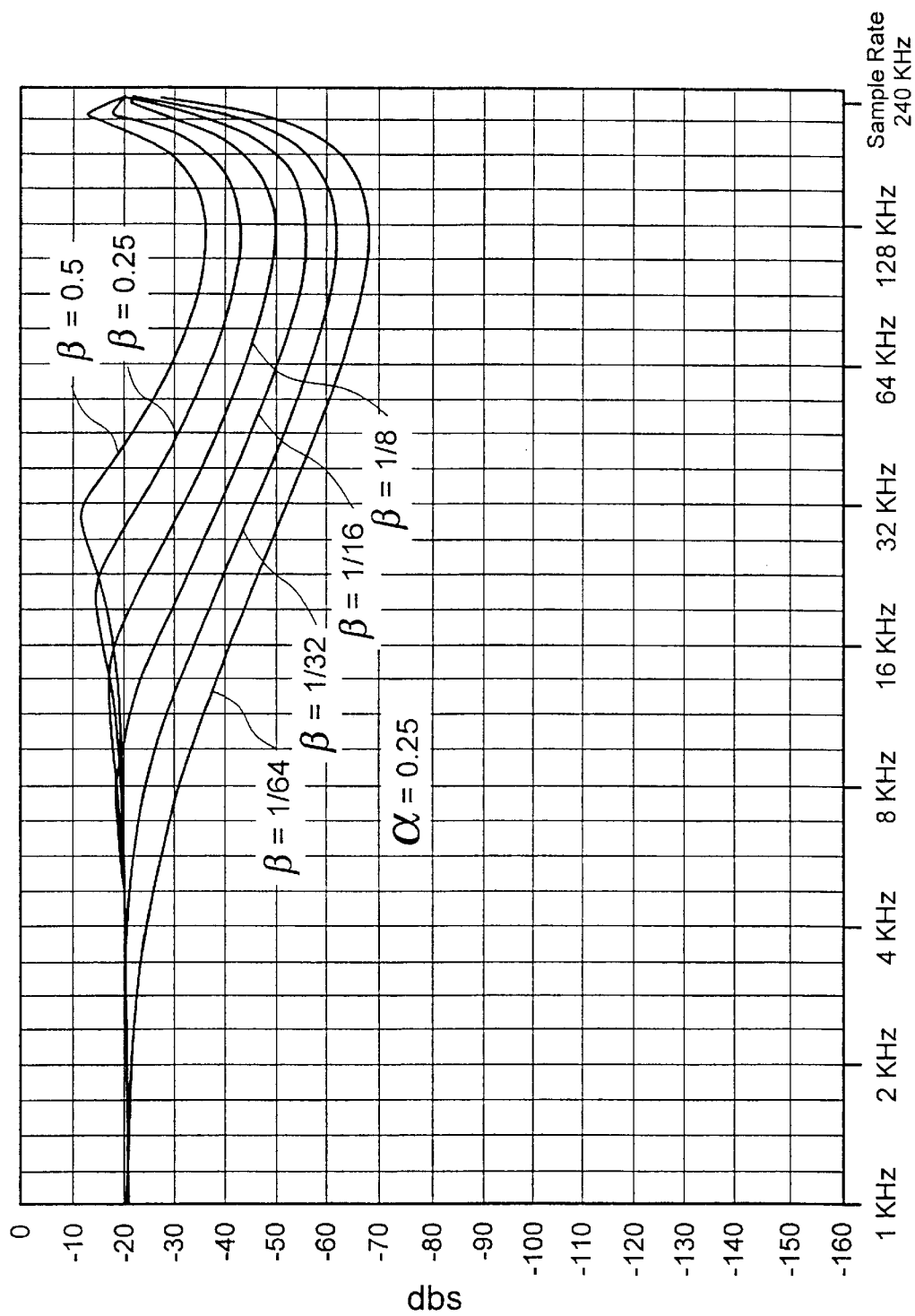
FIGS. 21–23 are graphs which illustrate various frequency transfer characteristics of exemplary second order phase locked loops.
Figure 22:
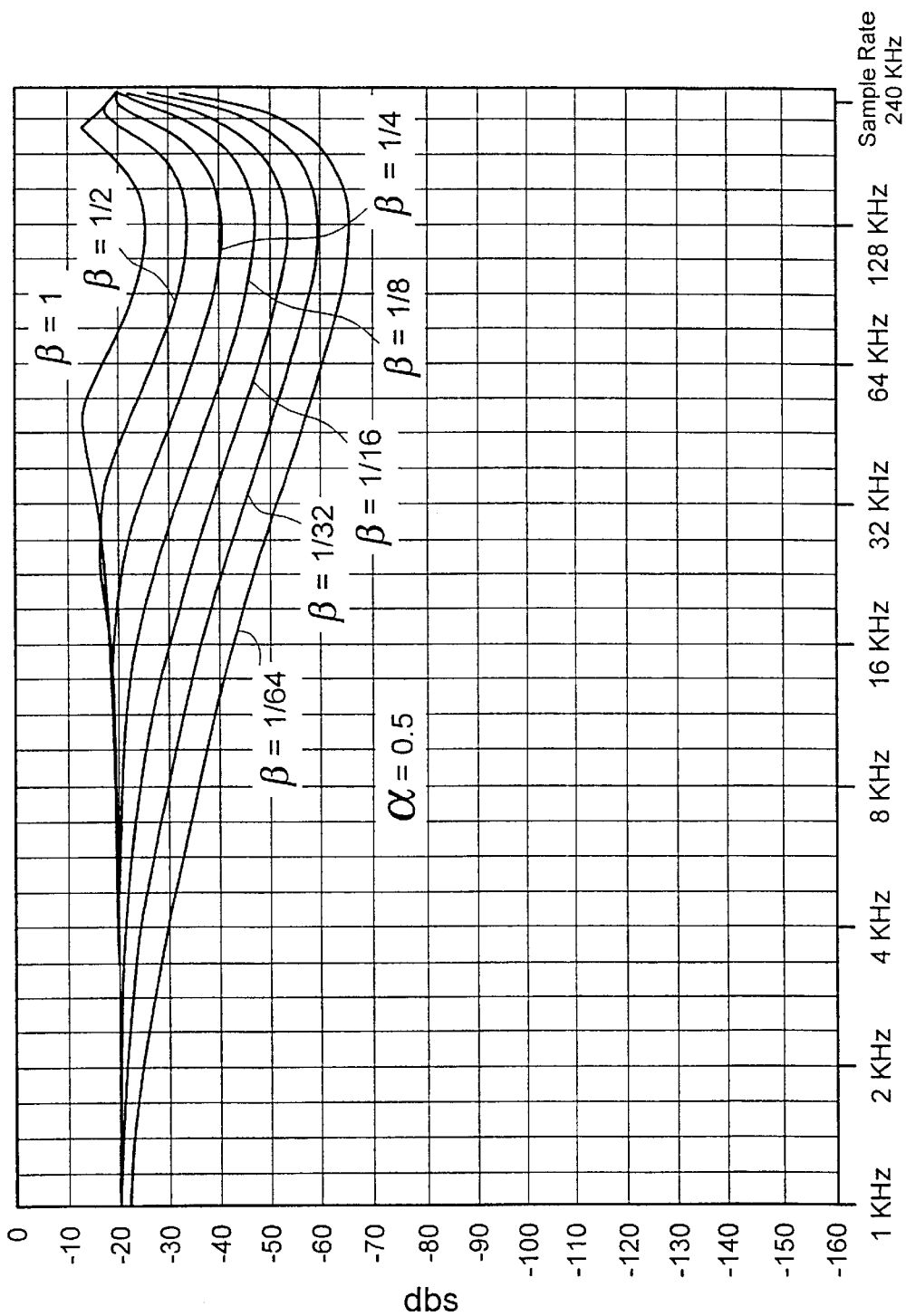
Figure 23:
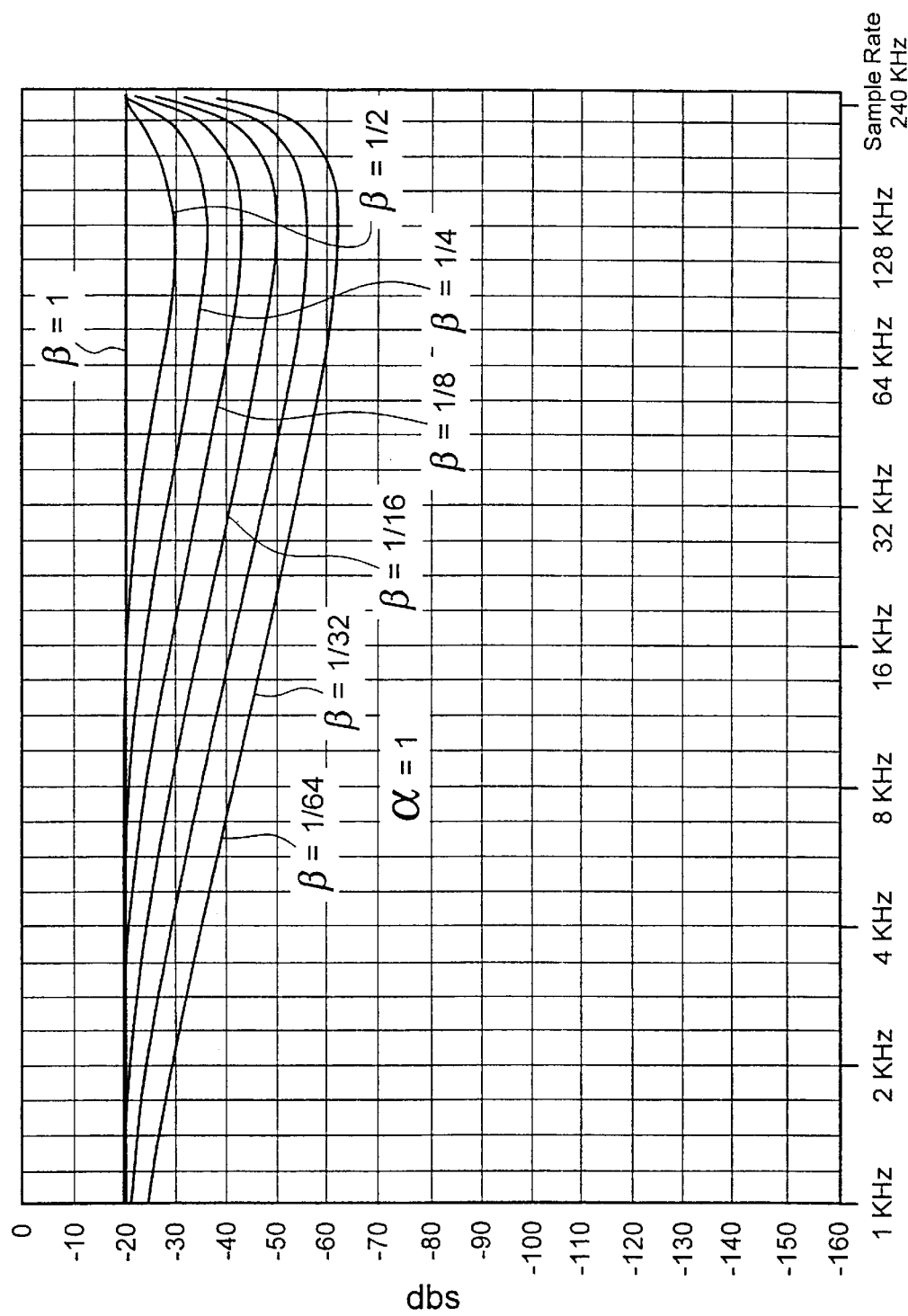

FIGS. 21, 22 and 23 are provided to show how the coefficients ALPHA and BETA can be chosen. FIGS. 21 to 23 give the loop attenuation from frequency in to frequency out as a function of the modulation frequency for ALPHA values of 1,0.5 and 0.25 and BETA values of 1 to 1/64. The loop attenuation characteristics should be substantially flat from 0 to 3.4 KHz and not exhibit excessive peaking at any frequency, which is a sign of imminent instability. Another function of such a loop is that it shall track the maximum rate-of-change of frequency. This occurs when the speech modulation is the loudest. Simulations showed that the loop with ALPHA=1/2, BETA=1/32 tracks the speech modulation when the RMS deviation is 16.67 KHz, but fails to track a deviation of 33.33 KHz RMS. It can be seen from FIG. 22 that the frequency response is approximately 3 dB down at 3.4 KHz with BETA=1/32. Raising the value of BETA to 1/16 with ALPHA=0.5 gives a loop which is nearly flat to 3.4 KHz and the loop was confirmed to track 33.33 KHz RMS deviation with these parameters. From FIG. 21, the values ALPHA=0.25, BETA=1/16 are also suggested, and the loop also tracks 33.333 KHz deviation with those parameters. The audio SNR with 6-bit phase quantizing and 20625 Hz frequency offset was computed and yielded the following figures:

| RMS DEVIATION | AUDIO SNR | EQUIVALENT NOISE DEVIATION |
|---|---|---|
| 33.33 KHz | 63.8 dB | 22 Hz |
| 16.67 KHz | 56.5 dB | 25 Hz RMS |
| 1.667 KHz | 46.6 dB | 8.8 Hz RMS |
| 167 Hz | 25.2 dB | 9 Hz RMS |

The above results show that the speech digitizing systems according to the present invention using frequency modulation possess some of the desirable characteristics of a companded method whereby the quantizing noise for small signals is less than the quantizing noise for large signals. The quantizing noise in quiet periods or speech pauses is thus reduced, improving the subjective audio quality. The above results may be compared against a typical dynamic range specification for a wireless telephone application. This dynamic range specification is expressed in the diagram of FIG. 24.

Therein, level 'A' indicates the RMS level of normal speech. The dynamic range shall be designed to accommodate speakers talking at an average level 'B' which is 15 dB higher than the normal speech level 'A'. Moreover, the speech peaks of the loudest speaker are accommodated without distortion. This is usually taken to mean in these types of specifications that the 3-sigma limit of an assumed Gaussian amplitude probability distribution shall be accommodated, or else that a +10 dB crest factor shall be used. This results in the level denoted by 'C' in FIG. 24.

The exemplary system shall also meet a minimum signal-to-noise ratio for the quietest speaker. The quietest speaker can be characterized as speaking at a level that is 15 dB below a normal speaker, namely at level 'D'. Signal-to-noise ratio is however normally defined with a sine wave test tone that has the same peak level as the maximum speech level, i.e., at the peak level 'E' and not the RMS level 'D' of the quietest speaker. The Test Tone to Noise Ratio (TTNR) shall be 50 dB when defined in this way. Moreover, the noise may be defined as the residual noise when the test tone signal is switched off, i.e., the noise during periods of silence. Taking into account that the RMS value of the wanted sine wave test tone energy is 3 dB less than its peak value, this means that the noise floor shall be 53 dB below level 'E'. Comparing the noise floor level 'F', with the loudest speech peak level 'C' suggests that the total dynamic range required for a typical wireless communication application is 83 dB.

By ascribing the maximum deviation that can be handled using a 240 KHz phase sampling rate without exceeding a phase change of Pi between samples to level C (i.e., 120 KHz) then the noise floor must be 83 dB below this, i.e., at 8.4 Hz RMS. The above exemplary signal-to-noise simulations show a noise floor of 9 Hz with 6-bit phase quantizing, which is sufficiently close to be considered meeting the specification. Nevertheless it is of interest to find ways to further reduce the quantizing noise floor so as to provide some implementation margin. Exemplary techniques for reducing the noise floor could include any or all of the following: use of preemphasis, increasing the number of bits used in phase quantizing, increasing the frequency deviation and increasing the phase sampling rate. Each of these methods will be considered in turn.

Preemphasis is a well known technique in conventional FM radio systems for improving speech quality. With reference to the fact that most of the quantizing noise energy occurs at the top end of the audio frequency band, the frequency deviation produced by higher audio frequencies is increased at the modulator and the output of the demodulator correspondingly reduced at those frequencies, thereby attenuating the dominant noise components.

Microphones are normally designed to produce a flat frequency response from sound pressure wave input to electrical signal output. Therefore to use preemphasis requires that frequency response shaping be introduced between the output of the microphone and the input to the frequency modulator. This frequency response shaping produces amplification of high frequency components and therefore likely requires active circuitry. One goal of the present invention, however, is to facilitate the integration of all active circuitry on an integrated circuit chip. Therefore, on one solution can be to design the acoustic (i.e., mechanical) components of the microphone such as its diaphragm and surrounding cavities to effect an acoustic pre-emphasis. Alternatively, preemphasis circuit would preferably be integrated on a chip with external connections to the microphone. The microphone signals would thus enter the chip at a low level before amplification at which point they would be susceptible to noise pick-up. This form of preemphasis is not, therefore, the preferred solution although those skilled in the art will recognize when design tradeoffs will make this an acceptable solution.

A preferred form of preemphasis would be to use a microphone with a naturally rising frequency response that produces larger electrical inputs for the same sound pressure vibration level at higher frequencies. Such specially tailored microphones may not, however, be generally available, so the other methods described of obtaining improved voice quality (e.g., using one more bit of phase precision) can be employed in conjunction with any available microphone.

One method to improve voice quality is to increase the number of bits used to represent quantized phase. Each extra bit of phase quantizing accuracy provides a 6 dB improvement of audio quality. Increasing phase quantizing accuracy equates to timing transitions of the FM carrier signal to a finer time accuracy. This can be done by utilizing a higher clock frequency as the reference for the phase digitizer, or by timing transitions to a fraction of a clock cycle. For example, a sawtooth clock waveform can be generated with a linear ramp-up with a repetitive reset-to-zero. The ramp can be sampled upon the occurrence of transitions of the FM carrier signal to determine its amplitude, thereby quantizing the transition time to a fraction of a clock cycle. Other related methods can include the generation of sine and cosine clock waveforms which are sampled upon occurrence of a transition, the fractional phase value then being given by the arctangent of the sine/cosine sample ratio. These methods involve analog circuit concepts which are not especially desirable for integration onto a digital integrated circuit. A method more suitable for integration is to compute an average phase over more than one transition occurring between phase sampling instants. For example, if phase is to be sampled at 240 K samples/S and the FM carrier frequency is nominally 1 MHz, there will be at least three positive-going transitions and at least three negative going transitions of the carrier within each 240 KHz period. Both negative transitions and positive transitions can be used if the phase samples produced by the former are corrected for the 180 degree phase difference between half-cycles. Care should be exercised when averaging angle measurements, as the correct average of −179 and +179 degrees is 180 degrees and not zero. The theoretically best method to average angles is to average their cosines and their sines separately and to calculate the ARCTAN of the result. This technique is known as circular averaging.

The aforementioned digital phase locked loop (PLL) provides a simpler practical method for averaging phase measurements from a large number of signal transitions. Furthermore, the phase digitizer (not shown) preceding the digital PLL of FIG. 18 may be eliminated, and the phase digitization performed by the PLL itself. This reduction is possible because the current application of the PLL for inventive digitization of an audio signal involves digital FM demodulation in the absence of radio noise.

Figure 25:
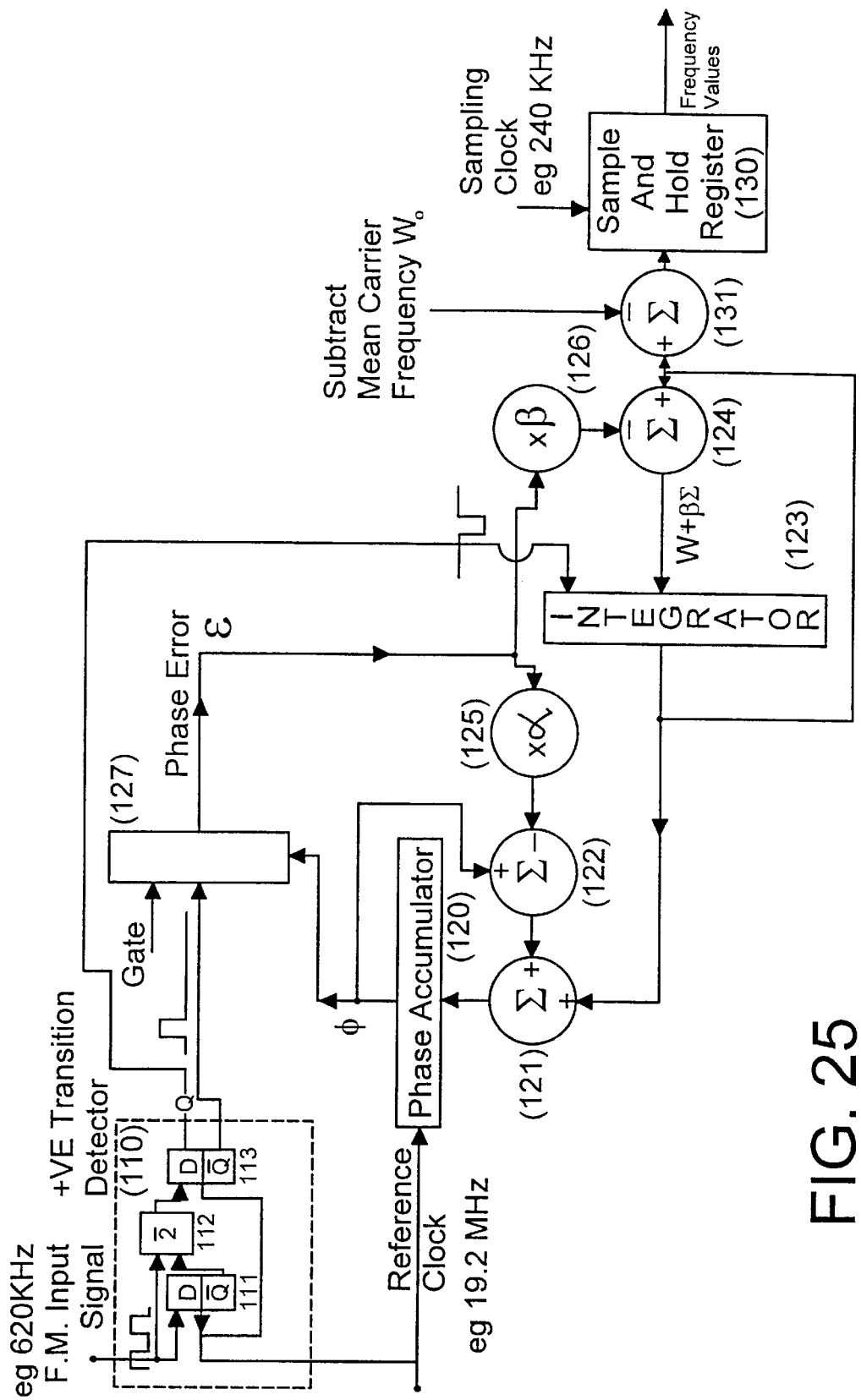
FIG. 25 is a block diagram representation of a phase locked loop which can be used as a demodulator according to the present invention.

An exemplary PLL system is shown in FIG. 25. The FM input signal is applied to transition detector 110. When the input signal transitions from a previous logic '0' level which has been stored in flip-flop 111 to a logic '1' level, then the Q output of flip-flop 111 will be a '1' and the inputs of two-input NAND gate 112 will be fulfilled, applying a logic '0' to the D input of flip-flop 113. This input will be registered in flip-flop 113 upon occurrence of the reference clock pulse resulting in a rising edge on the Q output of 113 and a falling edge on the Q output. A binary logic '1' on the Q output operates gate 127 to allow the contents of phase accumulator 120 to appear on the output of gate 127 as long as the control input is a logic '1'. This value is multiplied by ALPHA in multiplier 125 and subtracted from the phase value PHI received from accumulator 120 in subtractor 122. This occurs for a single reference clock cycle, because after the FM signal input's transition has passed, the Q output of flip-flop 113 will return to logic '0' causing gate 127 to resume outputting the value zero. The value ALPHA.E will thus be added to the phase accumulator 120 only once, while the frequency value ω gets added at every reference clock pulse. While gate 127 is passing the phase accumulator value, it is also multiplied by BETA in multiplier 126 and subtracted from the previous value of ω in subtractor 124. The new value is then registered in integrator register 123 on the rising edge of the Q output of flip-flop 113, coincident with gate 127 being returned to the zero output condition. The decrement BETA.E to the previous value of ω is thus permanent. The modified value of ω permanently affects the rate at which phase accumulator 120 increments, i.e., it affects the phase derivative, while the value ALPHA.E affects the phase only once, permanently affecting the phase value but not its derivative. In this way the coefficients ALPHA and BETA may be chosen to form a second order digital phase lock loop with desired characteristics as before. ALPHA and BETA are preferably chosen to be inverse powers of two so that the multiplication reduces to a shift. The values of ALPHA and BETA are analogous to those of the previous discussion on digital PLL design, except that the value of BETA is scaled down because the phase derivative value ω is added to the phase accumulator 120 many times between each iteration. The number of additions is equal to the number of reference clock pulse periods in a nominal period of the FM input signal. For example, suppose the FM input signal frequency is 620 KHz and the reference clock is 19.2 MHz. On average, the value ω is added to the phase accumulator 19200/620=31 times approximately per cycle of the FM input. The value of BETA thus should be about 1/32 of the values indicated in FIGS. 21–23 for this exemplary PLL. Moreover the loop frequency response characteristics will exhibit a wider bandwidth in proportion to the increased update frequency, which is now equal to the FM input frequency, for example 620 KHz instead of 240 KHz. Thus lower values of ALPHA and BETA should be used to maintain similar loop frequency responses. Since the frequency value ω will be sampled by a lower frequency sampling clock using sampler 130, it is desirable that the loop frequency characteristics attenuate frequencies above half the final sampling rate in order to avoid the aliasing phenomenon. FIG. 21 can be used to find appropriate values of ALPHA and BETA as follows.

The loop update rate (e.g., 620 KHz) is 620/240 times that used to produce FIG. 21, so the horizontal frequency scale is scaled accordingly. The values ALPHA=0.25, BETA=1/32 produced a bandwidth flat to about 4 KHz before, and thus would be flat to 4 KHz×620/240=10.33 KHz with the higher update rate. The loop previously exhibited 30 dB of attenuation at 45 KHz approximately. Thus 30 dB of attenuation will occur at 45 KHz×620/240, which is less than half the 240 KHz sampling rate envisaged for sampler 130. The loop should thus provide adequate attenuation of aliasing components without extra digital filtering prior to sampling. The exemplary values of ALPHA and BETA suggested for the arrangement of FIG. 25 are thus ALPHA=0.25, BETA=1/1024, the 32:1 reduction of BETA being for the reasons discussed above.

The value of ω held in flip-flop 123 of FIG. 25 represents the input signal carrier frequency $\omega_0$ plus the instantaneous frequency deviation dω due to the audio modulation. Only the latter is of interest so the mean frequency $\bar{\omega}_0$ should be removed before sampling. In FIG. 25 this is accomplished by subtractor 131. The mean frequency subtracted can be computed by later digital signal processing and fed back, so no specific circuitry is shown in FIG. 25 for computing the mean frequency.

Figure 26:
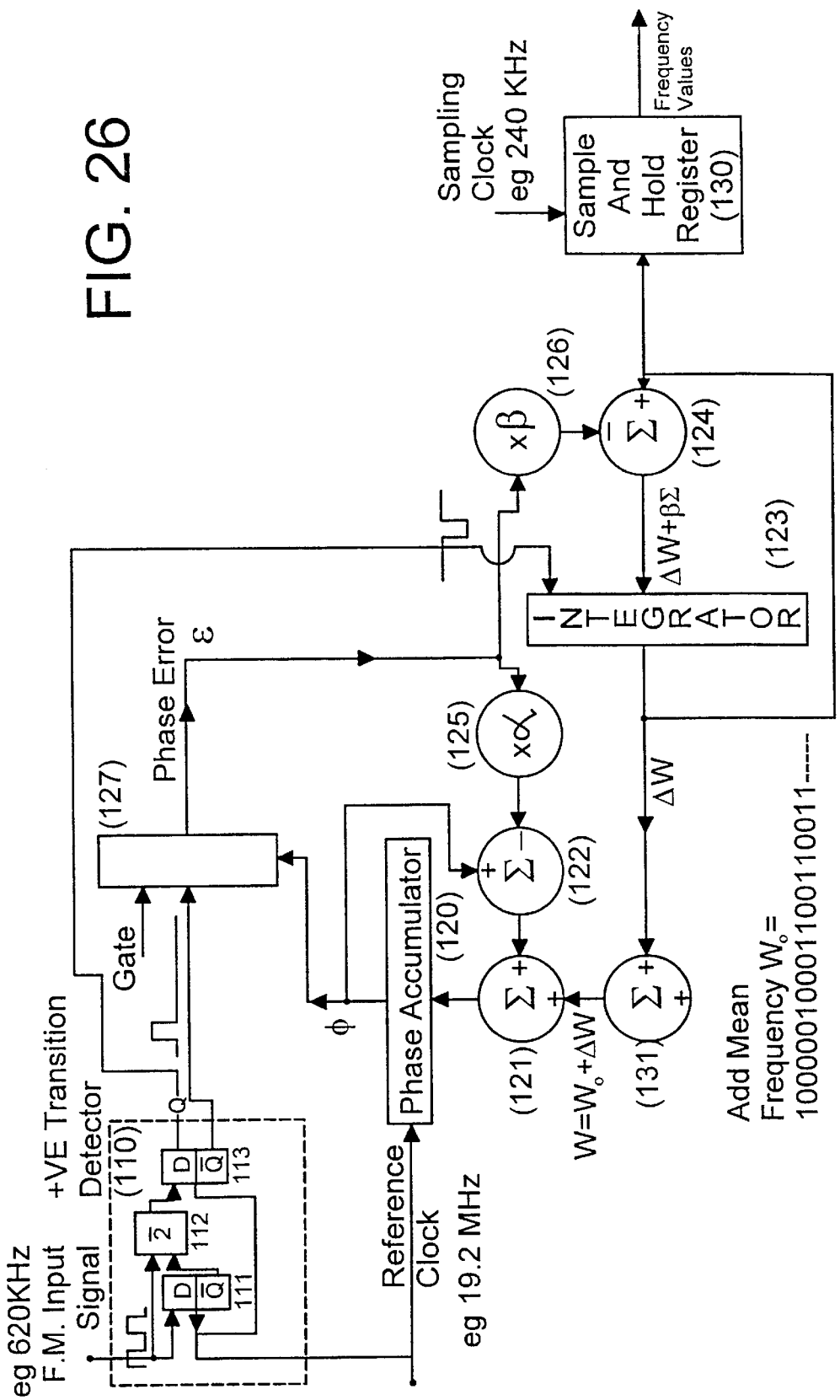
FIG. 26 is a block diagram illustrating a modification of the exemplary embodiment of FIG. 25 which includes mean frequency adjustment.

In other exemplary embodiments, it may be desirable that some provision be made to set the initial contents of flip-flop 123 to the expected mean frequency in order to avoid delay in initial acquisition of phase lock. This can be accomplished at the same time as subtracting the mean frequency by the re-arrangement of FIG. 26. In FIG. 26, the frequency flip-flop 123 holds the deviation of frequency dω from the mean. Instead of the subtractor 131 of FIG. 25, adder 132 of FIG. 26 is provided. The adder 132 adds the mean frequency $\bar{\omega}_0$ to obtain the increment rate $\omega = \bar{\omega}_0 + d\omega$ of the phase accumulator. This mean frequency is envisaged to be set by feedback from further processing, and thus accomplishes both the initial frequency setting function and the elimination of the mean frequency from the sampled output of sampler 130.

Figure 27:
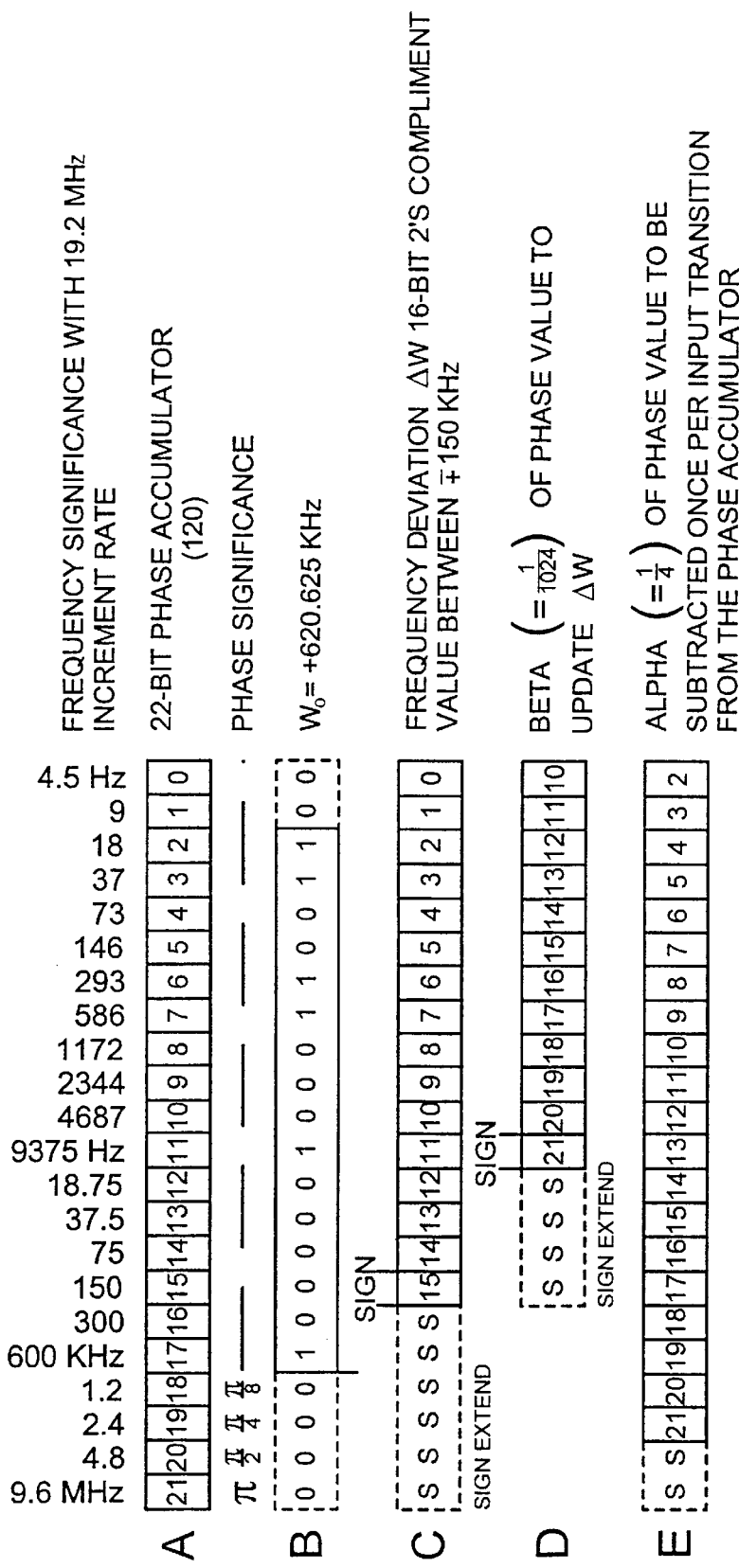
FIG. 27 illustrates exemplary word lengths for various digital quantities used in the exemplary embodiments of FIG. 26.

FIG. 27 illustrates exemplary word lengths of the various digital quantities in FIG. 26. The phase accumulator 120 is shown as the 21-bit register A, along with the phase and frequency significance of its bits. The frequency significance applies when the indicated bit is added at a 19.2 MHz rate. For example, if a most significant 11, is repetitively added, the phase accumulator will execute the sequence 10000 . . . , 00000 . . . , 10000 . . . , etc., which represents the phase sequence 0,Pi,0,Pi . . . This produces a complete cycle every two reference clock periods, that is 9.6 Megacycles per second. Each successive bit has half the frequency significance and the least bit has approximately 9 Hz significance. (9.6 MHz/2**20)

The increment $\omega_0$ required to produce a nominal frequency of 620.625 KHz is shown in register B of FIG. 27. The most significant four bits of the increment are zero as is the least significant bit, thus 16-bits are sufficient to define $\omega_0$. The frequency deviation $d\omega$ around $\omega_0$ is represented by register C. If the frequency deviation is within +/−150 KHz it can be represented by a 16-bit value. The most significant bit (i.e., the 150 KHz accumulator bit) is regarded as the sign and is sign extended for addition to phase accumulator 120. The instantaneous frequency deviation value $d\omega$ is updated by subtracting 1/1024 of the phase accumulator's value at the moment the input signal undergoes a positive transition. Register D shows the accumulator value shifted back by 10 binary places representing division by 1024. The twelve remaining bits are sign extended to 16 bits in Register D for addition to the 16-bit dw value C. Finally, register E shows the accumulator multiplied by ALPHA (e.g., 0.25) which is a two-bit left-shift.

In FIG. 26, the accumulator phase value is tested with every input signal transition from low to high, at a rate of greater than 470 KHz so that the frequency deviation is never more than 150 KHz. If the phase change between samples shall at the absolute maximum never be greater than +/−Pi, a peak frequency deviation of 235 KHz can be used. In fact, according to this exemplary embodiment, the frequency can deviate no more than +/−150 KHz, which is still an increase on the exemplary system of FIGS. 2–24 which restricted the frequency deviation to about 100 KHz. The normal audio deviation may thus be increased by approximately 3 dB compared with the values previously considered, giving a dynamic range improvement of 3 dB. On the other hand, input signal transitions were previously envisaged to be quantized to a half cycle of the 19.2 MHz reference clock giving 6-bit phase quantizing. Transitions are quantized in the systems of FIGS. 25 and 26 to one cycle of the reference clock, reducing the equivalent phase quantizing accuracy to 5-bits, a loss of 6 dB. However, this is more than made up by the increase in sampling rate from 240 KHz to 600 KHz approx, as the quantizing noise power in the 3.4 KHz audio range reduces with the cube of the sampling rate (9 dB for 2:1). The arrangement of FIGS. 25–27 is thus expected to show at least a net 6 dB reduction of quantizing noise after downsampling the frequency output words to 8K samples/second.

Methods for converting an acoustic pressure wave to a frequency or phase modulated electrical signal can include the use of a capacitor microphone, which forms part of the resonant circuit of an oscillator; a variable inductance microphone forming part of an oscillator circuit; air electret or piezoelectric crystal microphone connected to one or more variable capacitance diodes which form part of an oscillator circuit, or any microphone producing a voltage or current signal that controls a voltage or current-controlled oscillator.

Figure 24:
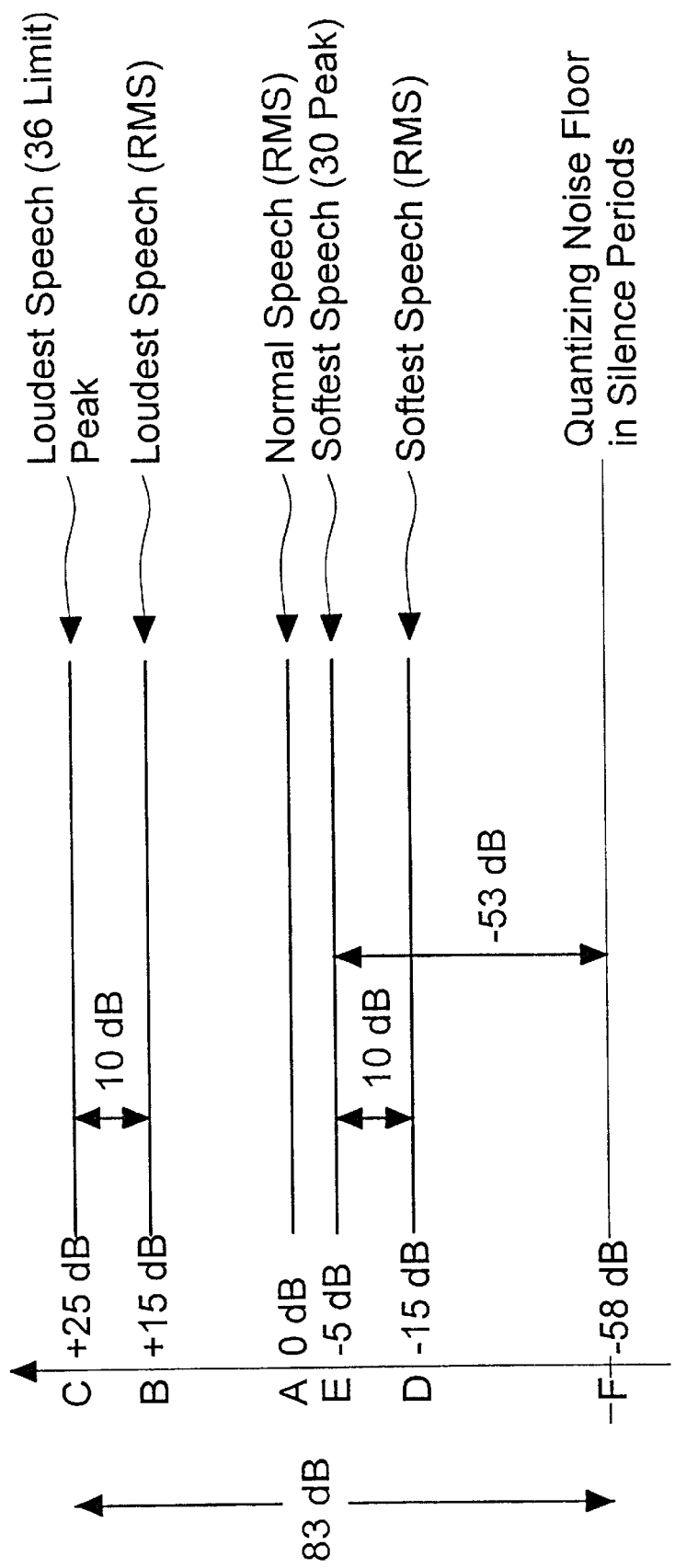
FIG. 24 illustrates an exemplary dynamic range specification for a typical wireless communication application.
Figure 28B:
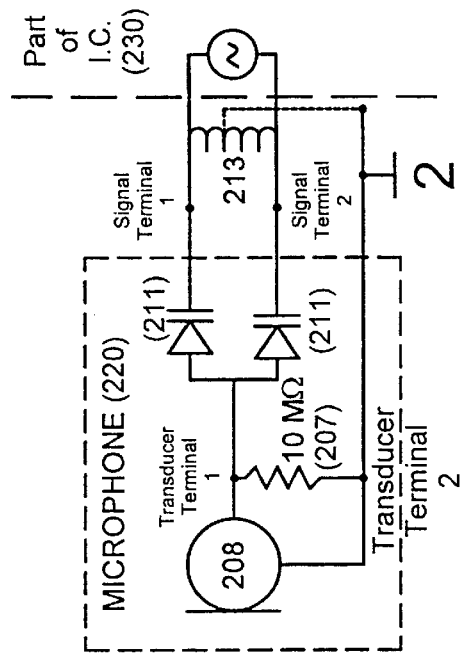
FIG. 28(*a*) illustrates a conventional microphone circuit arrangement.
Figure 28A:
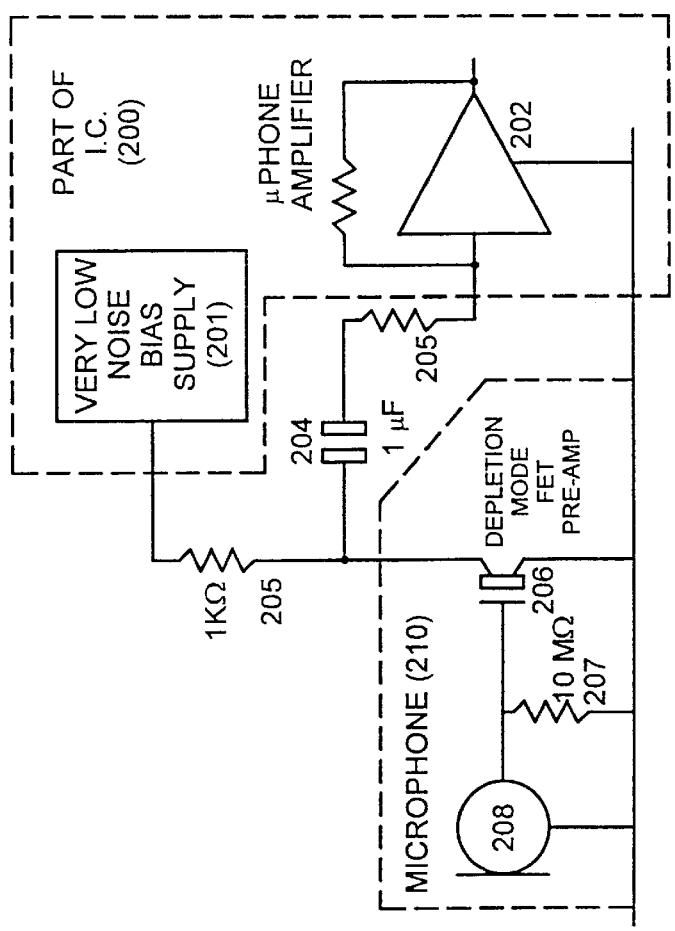

FIG. 28(*a*) illustrates a conventional microphone arrangement. The conventional arrangement includes microphone 210 containing piezoelectric transducer 208, high value resistor 207 and FET pre-amplifier 206. The FET preamplifier commonly has an open collector output which is used both to apply bias to the FET and to obtain the audio output, the microphone thereby remaining a two-terminal component. Bias is applied from low-noise bias voltage source 201 through resistor 205 across which the current flow through the FET develops the audio signal. The DC voltage level on the output is arbitrary and is removed by blocking capacitor 204 before further amplification in microphone amplifier 202. One disadvantage of this conventional arrangement is the need for the exceptionally low-noise bias supply 201. Typically, the normal RMS voice signal from the microphone corresponding to level A of FIG. 24 is 5 mV RMS. The noise floor is required to be 58 dB below this level, that is 6 $\mu$V. The conventional circuit of FIG. 28(*a*) is, however, very susceptible to noise from the bias supply as well as to noise pickup on the signal from resistor 205 through capacitor 204 and resistor 203 to microphone amplifier 202.

An exemplary microphone arrangement which overcomes these disadvantages according to the present invention is shown in FIG. 28(*b*). Therein, microphone 220 now incorporates piezoelectric element 208 and resistor 207 as before but lacks FET pre-amplifier 206. No bias supply current is therefore needed. Instead the piezoelectric element (electret) 208 output voltage varies the capacitance of varactor diodes 211 and 212 which, with inductor 213, form the resonant circuit for oscillator 230. The oscillator is preferably a relatively low-level oscillator that does not apply enough AC voltage swing to varactor diodes 211 and 212 that they might be driven into forward conduction. It is preferable to operate varactor diodes 211 and 212 with zero reverse bias voltage to avoid the need to generate a low-noise bias voltage, and also in order to maximize the frequency-modulation sensitivity of the oscillator. A ground line from a center-tap on inductor 213 (illustrated by a dotted line in FIG. 28(*b*)) is suggested to ensure that no low-frequency (audio) noise pickup can occur on the lines between varactors 211 and 212 and inductor 213. The low-level oscillation produced by oscillator 230 may nevertheless be 100 mV or more as the varactor diodes will not be driven into forward conduction until 300–400 mV is reached. The oscillator signal is thus 20 times higher than the microphone signal of the conventional microphone circuit arrangement of FIG. 28(*a*), and furthermore is a high frequency FM signal that is relatively immune to interference pickup. In this way the inventive system provides both circuit simplification by elimination of the bias supply 201 and microphone amplifier 202 as well as greatly reduced susceptibility to noise pickup.

Figure 29:
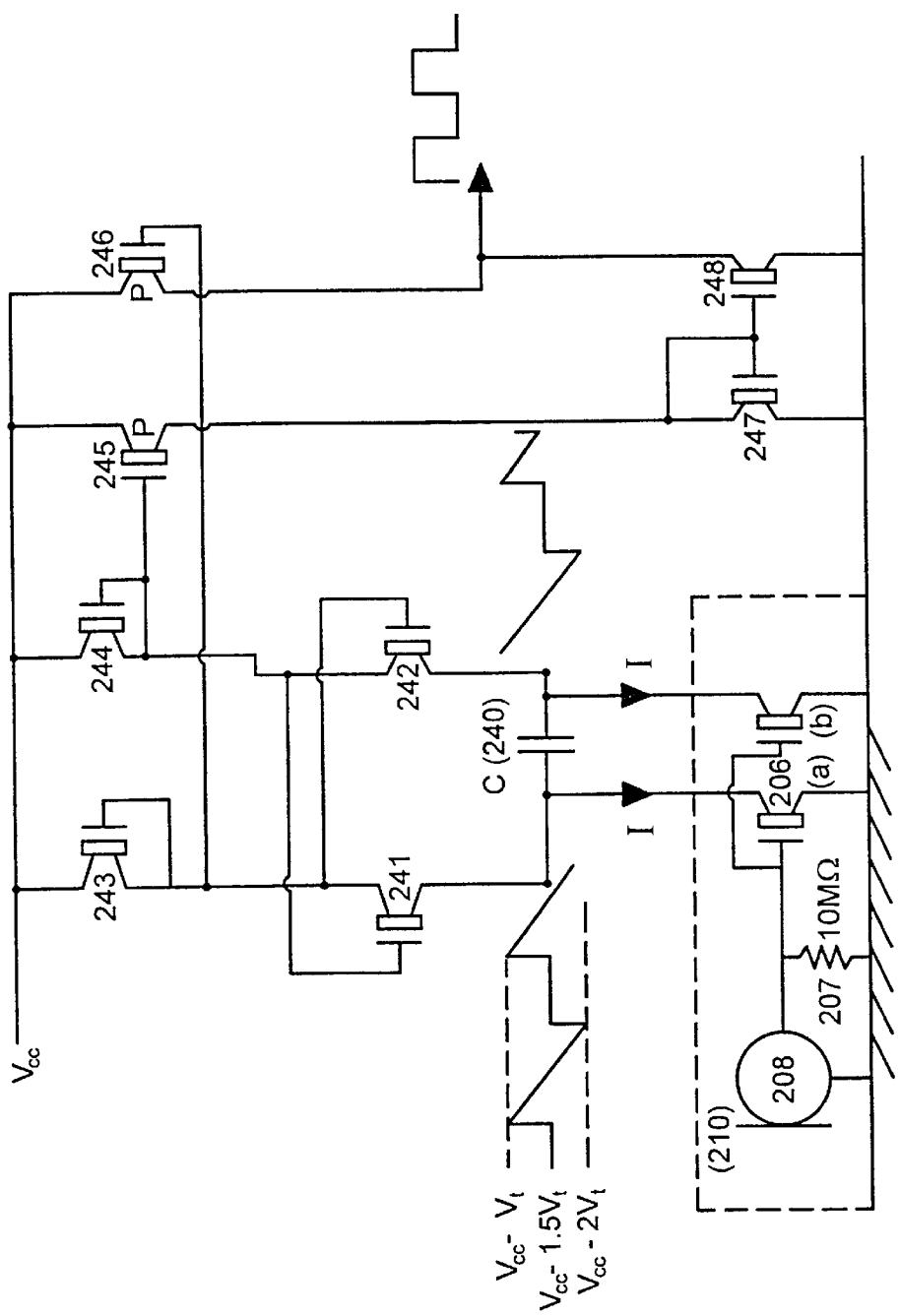
FIG. 29 illustrates an exemplary source coupled multivibrator which can be used as a current controlled oscillator according to an exemplary embodiment of the present invention.

Alternatively, a circuit using a current-controlled oscillator can be used, an example of which is shown in FIG. 29. A known form of current controlled oscillator is the emitter-coupled multivibrator, or its FET equivalent, the source-coupled multivibrator, which is shown in FIG. 29. Microphone 210 now includes the electret element 208 and two identical FET transconductance amplifiers 206*a* and 206*b* which convert the electret audio voltage to a pair of audio current sources of magnitude I. These currents form the tail currents of N-type FETs 241 and 242 which are cross-coupled drain-to-gate and source-coupled by timing capacitor C 240. It can be shown that the circuit will oscillate with approximately the source waveforms indicated and with a frequency that is proportional to the current I. Providing that FETs 206a and 206b are good current sources, the audio current I and therefore the frequency modulation will not be strongly dependent on the supply voltage Vcc, thus a measure of immunity to supply voltage noise is obtained.

Figure 30:
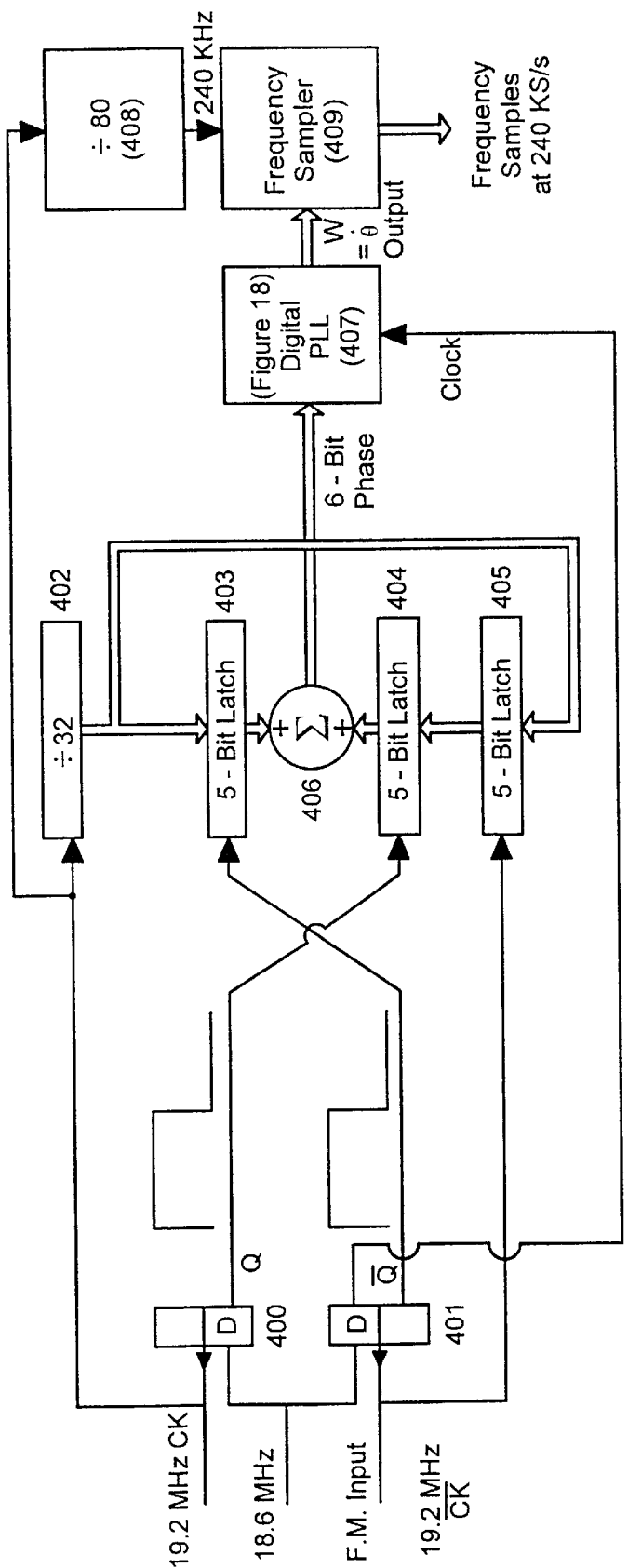
FIG. 30 is a block diagram representation of a digital mixer according to an exemplary embodiment of the present invention.

It may be desirable, in order to obtain a sufficiently high frequency deviation with any of the above described methods, to use a frequency modulated oscillator of a high frequency which is then mixed down to the desired 620 KHz range. Producing a peak deviation of, for example, +/−150 KHz of a 620 KHz oscillator could otherwise be difficult, as this is a high percentage change. On the other hand, producing a +/−150 KHz peak deviation of a 18.6 MHz oscillator, which is then mixed down to the 600 KHz range against a 19.2 MHz reference oscillator is more straightforward. A suitable mixing arrangement can be formed using digital logic components as shown in FIG. 30.

Therein, the FM input signal at nominally 18.6 MHz is applied to the D input of edge triggered flip-flops 400 and 401. Flip-flop 400 is clocked by the 19.2 MHz reference clock and flip-flop 401 by the inverted clock. The flip-flops produce square-wave outputs at the 600 KHz difference frequency that are relatively inverted. The relative inversion is rectified by using the Q output of flip-flop 400 and the $\overline{Q}$ output of flip-flop 401. Moreover, the 600 KHz output of flip-flop 400 has transitions that are synchronized to the 19.2 MHz clock rising edges while the output of flip-flop 401 is synchronized to the falling edges. Between the two, transitions of the 600 KHz difference frequency are thus preserved to a half cycle accuracy of the reference clock, which is used to obtain 6-bit phase quantizing.

The 19.2 MHz clock also drives reference divide-by-32 circuit 402. The output of circuit 402 increments on rising edges of the clock and is stable during the falling edge of the clock. The output of circuit 402 is also retimed to falling edges of the clock by latch 405. Thus the count sequence produced by circuit 402 and latch 405 is, for example:

Circuit 402: . . . 25 26 27 28 29 30 31 0 1 2 . . .

Latch 405: . . . 25 26 27 28 29 30 31 0 1 2 . . . .

Now depending on the transition timing of the 18.6 MHz FM input signal, a rising edge on the 600 KHz Q output of flip-flop 400 may occur one half cycle of the reference clock before a rising edge on the $\overline{Q}$ output of flip-flop 401 or vice versa. If the former occurs first, for example, at count 27 out of counter 402, the contents of latch 405 at that time will be 26, which number will be latched into latch 404. Then the output of flip-flop 401 will occur at count 27 of latch 405, at which point circuit 402 still contains 27, which number will become latched into latch 403. The sum of latches 403 and 404 produced by adder 406 will then be the 6-bit number 26+27=53.

If, on the other hand, the transition on the $\overline{Q}$ output of flip-flop 401 occurs on the clock half cycle before the Q output of 400 at the value 26 out of latch 405, then circuit 402 at that time contains the value 26, which will thus be latched in latch 403. Then, when the transition on the Q output of flip-flop 400 occurs at count 27 of circuit 402, latch 405 still contains 26, which value becomes latched in latch 404. The sum produced by adder 406 in this instance is 26+26=52, reflecting the occurrence of the 18.6 MHz input transition one half clock cycle earlier. In this way the sum output of adder 406 represents the signal phase to a timing accuracy of half a reference clock cycle. The 6-bit phase sequences are applied to a digital PLL 407 according to FIG. 18 along with a clock derived from the Q output of flip-flop 401 thus ensuring that phase values are only used long after the output of adder 406 has become stable. The ALPHA, BETA values of PLL 407 are chosen to provide the desired frequency response with the clock rate of 600 KHz, as previously described. The increased clock rate of 600 KHz compared to the value of 240 KHz that was analyzed in detail above provides at least 9 dB reduction of quantizing noise. The frequency estimates calculated and filtered by the PLL are then downsampled to 240 KHz by the output of divide-by −80 circuit 408. This is clocked by the rising edges of the reference clock while the PLL 407 updates its values synchronously with the falling edges, thus ensuring that downsampling occurs after updated frequency values have become stable. The 240K samples/S frequency values may then be further downsampled to 8 KHz using known downsampling filter techniques.

A number of variations of the invention have been disclosed from which further derivatives may be constructed by persons skilled in the art, while still adhering to the scope and spirit of the invention as described by the following claims.

I claim:

1. A microphone with immunity to electrical noise pick-up comprising:

a ground terminal and first and second signal terminals;

a piezoelectric transducer for converting sound pressure waves to a corresponding electrical voltage signal between a first and a second terminal, said second terminal being connected to said ground terminal;

an electrical resistor connected between said transducer's first and second terminal; a first varactor diode having an anode connected to said transducer's first terminal and a cathode connected to said first signal terminal; and a second varactor diode having an anode connected to said transducer's first terminal and a cathode connected to said second signal terminal.

2. A microphone according to claim 1 further comprising:

an inductance connected to said first and second signal terminals and forming part of an oscillator circuit.

3. A microphone with immunity to electrical noise pick-up comprising:

a ground terminal and first and second output terminals;

a piezoelectric transducer for converting sound pressure waves to a corresponding electrical voltage signal between a first and a second terminal, said second terminal being connected to said ground terminal;

an electrical resistor connected between said transducer's first and second terminal;

a first field effect transistor having a gate electrode connected to said transducer's first terminal, a source electrode connected to said ground terminal and a drain electrode connected to said first output terminal; and a second field effect transistor having a gate electrode connected to said transducer's first terminal, a source electrode connected to said ground terminal and a drain electrode connected to said second output terminal.

4. A microphone according to claim 3 further comprising:

current controlled oscillator means connected to said first and second output terminals to produce a frequency modulated oscillation signal.

* * * * *